United States Patent
Itomi

(10) Patent No.: US 11,502,644 B2
(45) Date of Patent: Nov. 15, 2022

(54) VIBRATION DEVICE

(71) Applicant: Seiko Epson Corporation, Tokyo (JP)

(72) Inventor: Noboru Itomi, Nirasaki (JP)

(73) Assignee: SEIKO EPSON CORPORATION

( * ) Notice: Subject to any disclaimer, the term of this patent is extended or adjusted under 35 U.S.C. 154(b) by 0 days.

(21) Appl. No.: 17/456,396

(22) Filed: Nov. 24, 2021

(65) Prior Publication Data

US 2022/0166379 A1  May 26, 2022

(30) Foreign Application Priority Data

Nov. 26, 2020 (JP) .............................. JP2020-195824

(51) Int. Cl.
| | |
|---|---|
| H03B 5/04 | (2006.01) |
| H03B 5/32 | (2006.01) |
| H03L 1/02 | (2006.01) |

(52) U.S. Cl.
CPC ................ H03B 5/04 (2013.01); H03B 5/32 (2013.01); H03B 5/323 (2013.01); H03L 1/026 (2013.01); H03L 1/028 (2013.01); *H03B 2201/0208* (2013.01)

(58) Field of Classification Search
CPC .............. H03B 5/04; H03B 5/30–368; H03B 2201/0208; H03H 9/0557; H03H 9/13–132; H03H 9/15; H03H 9/19; H03L 1/02; H03L 1/022–026; H03L 1/028; H03L 1/04
See application file for complete search history.

(56) References Cited

U.S. PATENT DOCUMENTS

| | | | |
|---|---|---|---|
| 2016/0218718 A1* | 7/2016 | Yamamoto | ............. H03B 5/368 |
| 2016/0218719 A1* | 7/2016 | Yamamoto | ................ H03L 1/02 |

FOREIGN PATENT DOCUMENTS

| | | |
|---|---|---|
| JP | 2010-206443 A | 9/2010 |
| JP | 2010-252210 A | 11/2010 |

* cited by examiner

*Primary Examiner* — Levi Gannon
(74) *Attorney, Agent, or Firm* — Harness, Dickey & Pierce, P.L.C.

(57) ABSTRACT

A vibration device includes a base including a semiconductor substrate and through electrodes that pass through the portion between first and second surfaces of the semiconductor substrate, and a vibrator fixed to the first surface via an electrically conductive joining member. The following components are placed at the second surface: an oscillation circuit that is electrically coupled to the vibrator via the through electrodes and generates an oscillation signal by causing the vibrator to oscillate, a temperature sensor circuit, a temperature compensation circuit that performs temperature compensation on the oscillation signal, and an output buffer circuit that outputs a clock signal based on the oscillation signal. Dsx1<Dbx1, a distance between the output buffer circuit and one of the through electrodes is Dbx1, a distance between the temperature sensor circuit and the other through electrode is Dsx1.

11 Claims, 14 Drawing Sheets

VIBRATION DEVICE

The present application is based on, and claims priority from JP Application Serial Number 2020-195824, filed Nov. 26, 2020, the disclosure of which is hereby incorporated by reference herein in its entirety.

BACKGROUND

1. Technical Field

The present disclosure relates to a vibration device and the like.

2. Related Art

Vibration devices, such as oscillators, have been known as devices using vibrators. For example, JP-A-2010-206443 discloses a temperature compensated oscillator in which a vibrator is housed in a first recess of a package having an H-shaped cross section and an IC (integrated circuit) chip including a temperature sensor circuit, a temperature compensation circuit, an oscillation circuit, and an amplification circuit is accommodated in a second recess.

An output buffer circuit that outputs a clock signal based on an oscillation signal from the oscillation circuit tends to consume a large amount of electric power and generate heat as compared with the other circuit blocks. In JP-A-2010-206443 described above, since the output buffer circuit, which is the amplifier circuit, and the temperature sensor circuit are formed in the same IC chip, the temperature sensor circuit tends to be affected by the heat generated by the output buffer circuit. On the other hand, in JP-A-2010-206443, the output buffer circuit and the vibrator are coupled to each other via internal wiring lines and other components in the package that accommodates the IC chip and the vibrator. The heat is therefore unlikely to be transmitted between the output buffer circuit and the vibrator as compared with the heat transmission between the output buffer circuit and the temperature sensor circuit. Therefore, when a temperature compensated oscillator is configured by using the structure described in JP-A-2010-206443, the temperature detected by the temperature sensor circuit deviates from the actual temperature of the vibrator due to the heat generated by the output buffer circuit.

SUMMARY

An aspect of the present disclosure relates to a vibration device including a base including a semiconductor substrate having a first surface that is a front surface and a second surface that is a rear surface and a through electrode that passes through a portion between the first and second surfaces, and a vibrator fixed to the first surface via an electrically conductive joining member. Components below are placed at the second surface, an oscillation circuit that is electrically coupled to the vibrator via the through electrode and generates an oscillation signal by causing the vibrator to oscillate, a temperature sensor circuit, a temperature compensation circuit that performs temperature compensation on the oscillation signal based on an output from the temperature sensor circuit, and an output buffer circuit that outputs a clock signal based on the temperature compensated oscillation signal. Dsx1<Dbx1 is satisfied, where Dbx1 represents a distance between the output buffer circuit and the through electrode, and Dsx1 represents a distance between the temperature sensor circuit and the through electrode.

DESCRIPTION OF EXEMPLARY EMBODIMENTS

Figure 1:
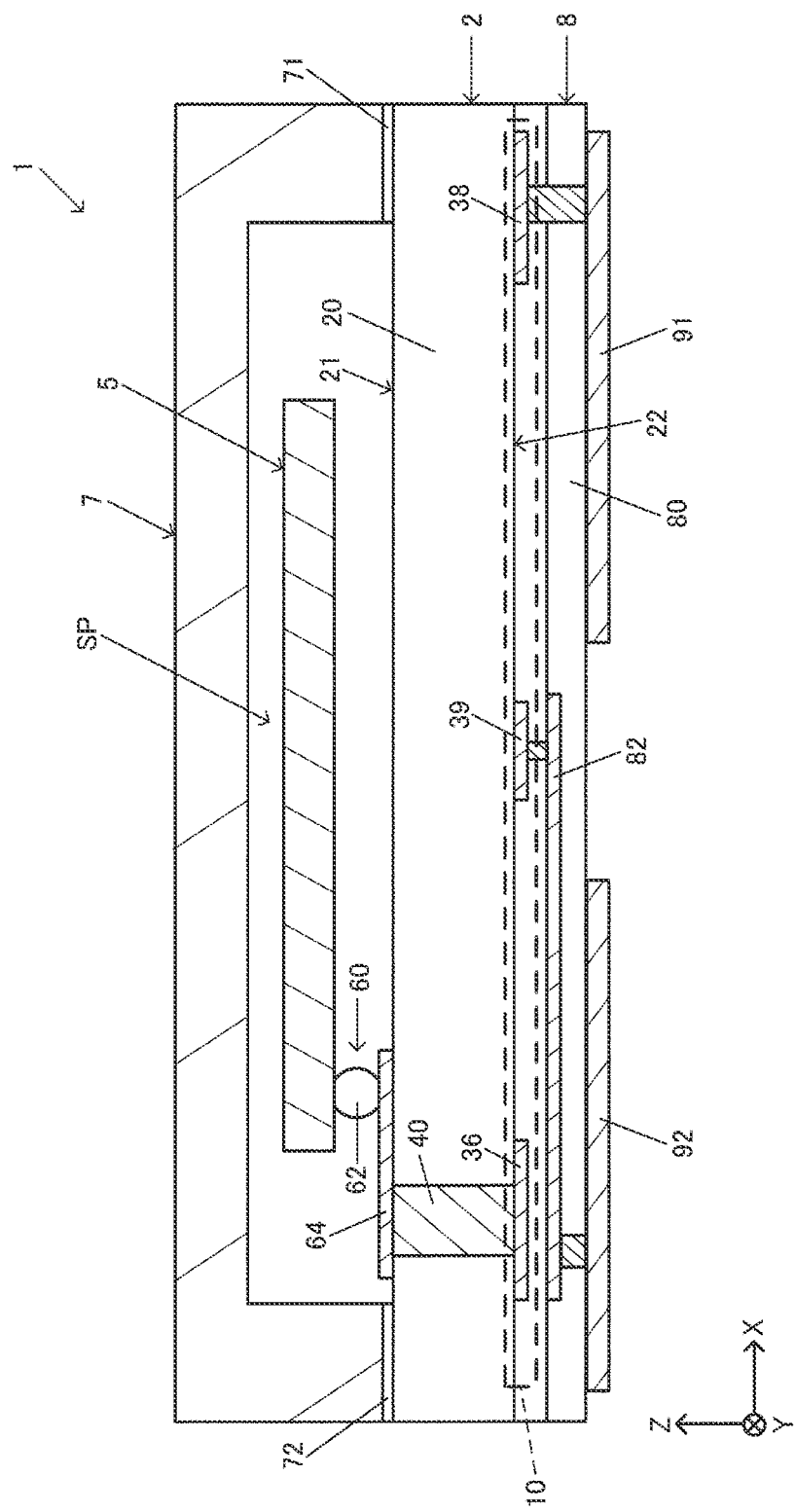
FIG. 1 is a cross-sectional view showing an example of the configuration of a vibration device according to an embodiment of the present disclosure.

An embodiment of the present disclosure will be described below. It is not intended that the present embodiment described below unduly limits the contents described in the appended claims. Furthermore, all configurations described in the present embodiment are not necessarily essential configuration requirements of the present disclosure. In the following drawings, some components may be omitted for convenience of the description. In the drawings, the dimensional ratios among the components differ from the actual values for clarity.

1. Vibration Device

FIG. 1 is a cross-sectional view showing an example of the configuration of a vibration device 1 according to the present embodiment. The vibration device 1 according to the present embodiment includes a base 2 and a vibrator 5, as shown in FIG. 1. The vibration device 1 can further include a lid 7, a relocation wiring layer 8, and external connection terminals 91 and 92. The base 2 includes a semiconductor substrate 20 and a through electrode 40. The semiconductor substrate 20 has a first surface 21, which is the front surface, and a second surface 22, which is the rear surface. The first surface 21 is, for example, the upper surface of the semiconductor substrate 20, and the second surface 22 is, for example, the lower surface of the semiconductor substrate 20. The through electrode 40 is an electrode that passes through the first surface 21 and the second surface 22 of the semiconductor substrate 20. The vibrator 5 is placed at the side facing the first surface 21 of the semiconductor substrate 20. For example, the vibrator 5 is placed in a position separate by a given separation distance from the first surface 21 of the semiconductor substrate 20. Specifically, the vibrator 5 is fixed to the first surface 21 of the semiconductor substrate 20, for example, via an electrically conductive joining member 60. The external connection terminals 91 and 92 are provided at the side facing the second surface 22 of the semiconductor substrate 20, for example, via an insulating layer 80. The insulating layer 80 is, for example, an insulating layer that forms the relocation wiring layer 8.

The figures described in the present embodiment show axes X, Y, and Z as three axes perpendicular to one another. The direction along the axis X is referred to as an "axis-X direction", the direction along the axis Y is referred to as an "axis-Y direction", and the direction along the axis Z is referred to as an "axis-Z direction". The tip side of the arrow in each of the axial directions is also referred to as a "positive side", and the base side of the arrow is also referred to as a "negative side". The positive side in the axis-Z direction is also referred to as an "upper side", and the negative side in the axis-Z direction is also referred to as a "lower side". For example, the axis-Z direction extends along the vertical direction, and the plane XY extends along the horizontal plane. FIG. 1 is a cross-sectional view of the vibration device 1 viewed in the axis-Y direction. The first surface 21 and the second surface 22 of the semiconductor substrate 20 are surfaces that extend along the plane XY and are perpendicular to the axis Z. The term "perpendicular" includes not only the case of intersection at 90° but also the case of intersection at an angle that slightly deviates from 90°.

The vibration device 1 is, for example, an oscillator. Specifically, the vibration device 1 is a temperature compensated crystal oscillator (TCXO), an oven controlled crystal oscillator (OCXO), a voltage controlled crystal oscillator (VCXO), a surface acoustic wave (SAW) oscillator, a voltage controlled SAW oscillator, a micro-electro-mechanical systems (MEMS) oscillator, or any other oscillator. The MEMS oscillator can be achieved by a MEMS vibrator in which a piezoelectric film and electrodes are placed at a substrate, such as a silicon substrate. The vibration device 1 may, however, be an inertia sensor, such as an acceleration sensor and an angular velocity sensor, or a force sensor, such as a tilt sensor.

The base 2 is formed of the semiconductor substrate 20. The semiconductor substrate 20 is, for example, a silicon substrate. The semiconductor substrate 20 is, however, not limited to a silicon substrate and may instead be a semiconductor substrate made, for example, of Ge, GaP, GaAs, or InP.

The base 2 further includes an integrated circuit 10. The integrated circuit 10, which is a semiconductor circuit, is formed at the second surface 22 of the semiconductor substrate 20. The integrated circuit 10 is formed of a plurality of circuit elements. The circuit elements are, for example, active elements, such as transistors, or passive elements, such as capacitors and resistors. Specifically, the integrated circuit 10 is formed of a plurality of circuit blocks each containing a plurality of circuit elements. The integrated circuit 10 is formed of two regions: a diffusion region that is an impurity region formed by doping an impurity into the semiconductor substrate 20; and a wiring region in which a metal layer and an insulating layer are layered on each other. The diffusion region forms the source and drain regions of the transistors, which form the circuit elements of the integrated circuit 10, and the wiring region forms wiring lines that couple the circuit elements to each other.

The base 2 further includes the through electrode 40. The through electrode 40 is made of an electrically conductive material that passes through the first surface 21 and the second surface 22 of the semiconductor substrate 20. For example, the through electrode 40 is formed by forming a through hole in the semiconductor substrate 20 and filling the through hole with the electrically conductive material. The electrically conductive material may be a metal, such as copper, or an electrically conductive polysilicon. The electrically conductive polysilicon refers to polysilicon into which an impurity, for example, phosphorus (P), boron (B), or arsenic (As), is doped to give the electrical conductivity. Use of polysilicon as the electrically conductive material allows achievement of a through electrode 40 sufficiently resistant to heat applied during the step of forming the integrated circuit 10.

One end of the through electrode 40 is electrically coupled to the vibrator 5 via the electrically conductive joining member 60. In FIG. 1, the electrically conductive joining member 60 is achieved, for example, by a bump 62 having one end electrically coupled to the vibrator 5 and the other end electrically coupled to the through electrode 40. Specifically, the other end of the bump 62 is coupled to the through electrode 40 via a terminal 64. The bump 62 is an electrically conductive bump, specifically a metal bump. The electrically conductive joining member 60 may be achieved, for example, by an electrically conductive adhesive.

The other end of the through electrode 40 is electrically coupled to the integrated circuit 10. Specifically, the other end of the through electrode 40 is coupled to the circuit elements of the integrated circuit 10 via a contact pad 36 formed in the integrated circuit 10. The vibrator 5 can thus be electrically coupled to the integrated circuit 10 via the through electrode 40.

The lid 7 is joined to the base 2 via joining members 71 and 72. The base 2 and the lid 7 form an airtight accommodation space SP, and the vibrator 5 is accommodated in the accommodation space SP. The accommodation space SP is hermetically sealed and has, for example, a depressurized state. The vibrator 5 can thus be stably driven. The state in the accommodation space SP is not limited to a depressurized state. For example, the accommodation space SP may be filled with an inert gas atmosphere.

The relocation wiring layer 8 is provided at the side facing the second surface 22 of the semiconductor substrate 20 and includes the insulating layer 80 and wiring lines 82 for relocated wiring lines. The insulating layer 80 is achieved, for example, by a resin layer made, for example, of polyimide, and the wiring lines 82 are achieved, for example, by metal wiring lines made, for example, of copper foil. The insulating layer 80 needs to have heat resistance high enough to withstand soldering performed when the vibration device 1 is mounted, and polyimide is preferably used as the material of the insulating layer 80. The wiring lines 82 may be made of a metal material, such as silver, in place of copper. The thickness of the wiring lines and terminals in the relocation wiring layer 8 is, for example, about 50 pm.

Providing the relocation wiring layer 8 allows electrical coupling between contact pads 38, 39 formed in the integrated circuit 10 and the external connection terminals 91, 92. The vibration device 1 can then be incorporated into an electronic instrument by coupling the external connection terminals 91 and 92 of the vibration device 1 to terminals and wiring lines of a circuit substrate or any other substrate on which the vibration device 1 is mounted. Providing the relocation wiring layer 8 also allows mechanical protection of the portions of the integrated circuit 10 and thermal protection of the integrated circuit 10 and other components from heat generated in a soldering step carried out when the vibration device 1 is mounted.

Figure 2:
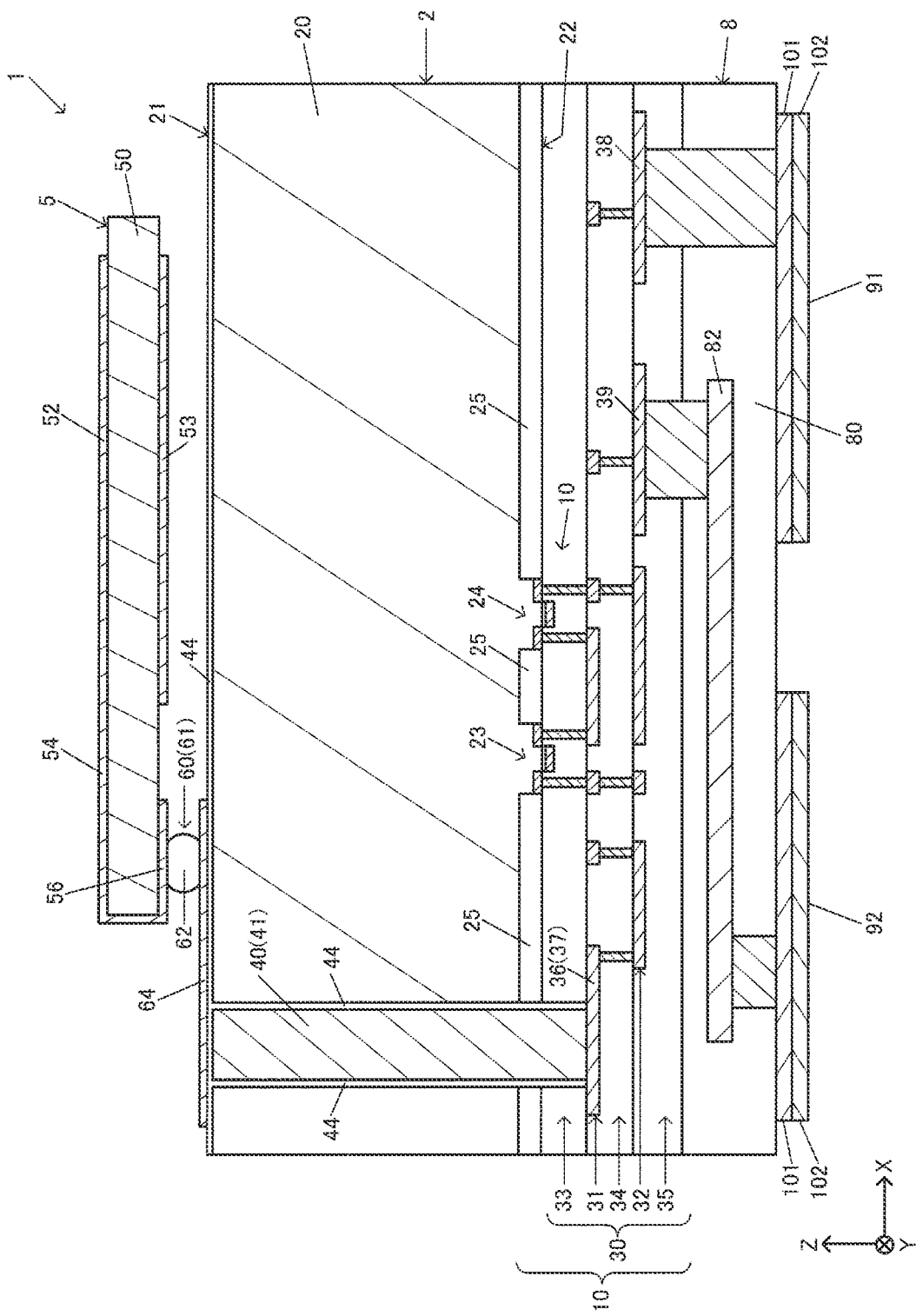
FIG. 2 is a cross-sectional view showing an example of a specific configuration of the vibration device according to the present embodiment.
Figure 3:
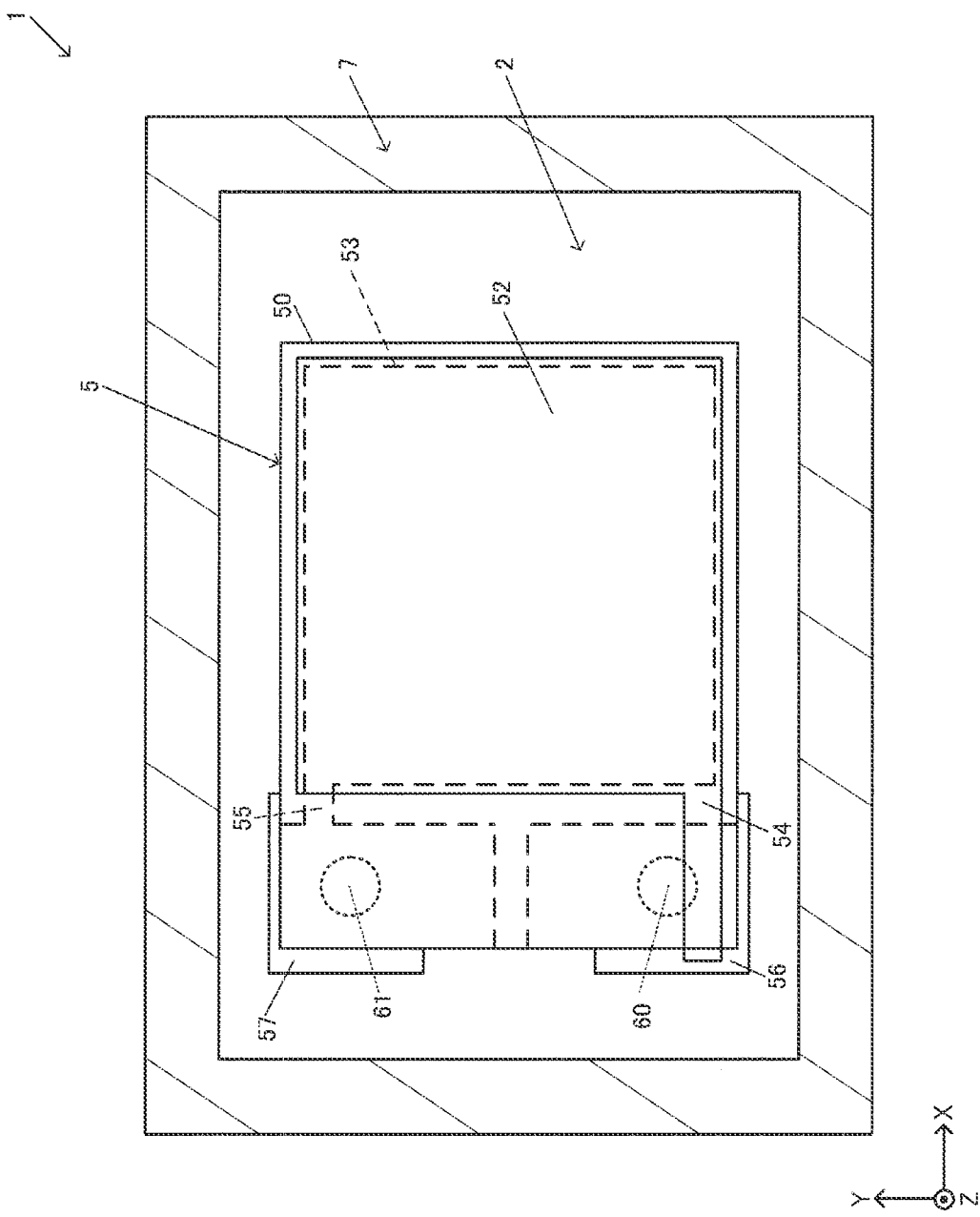
FIG. 3 is a plan view showing an example of a vibrator of the vibration device.

FIG. 2 is a cross-sectional view showing an example of a specific configuration of the vibration device 1, and FIG. 3 is a plan view showing an example of the vibrator 5 of the vibration device 1. The vibrator 5 will first be described in detail with reference to FIG. 3.

The vibrator 5 is a device that produces mechanical vibration in response to an electric signal. The vibrator 5 includes a vibration substrate 50 and electrodes placed at the surfaces of the vibration substrate 50, as shown, for example, in FIG. 3. The vibration substrate 50 operates in a thickness-shear vibration mode and is formed of an AT-cut quartz substrate in the present embodiment. The AT-cut quartz substrate has tertiary frequency-temperature characteristics and therefore allows the vibrator 5 to have excellent temperature characteristics. The electrodes are formed of an excitation electrode 52, which is placed at the upper surface of the vibration substrate 50, and an excitation electrode 53, which is placed at the lower surface of the vibration substrate 50 so as to face the excitation electrode 52. The upper surface is the surface on the positive side in the axis-Z direction, and the lower surface is the surface on the negative side in the axis-Z direction. One of the excitation electrodes 52 and 53 is a first excitation electrode, and the other one of the excitation electrodes 52 and 53 is a second excitation electrode. The electrodes include a pair of terminals 56 and 57 placed at the lower surface of the vibration substrate 50, a wiring line 54, which electrically couples the terminal 56 to the excitation electrode 52, and a wiring line 55, which electrically couples the terminal 57 to the excitation electrode 53.

The configuration of the vibrator 5 is not limited to the configuration described above. For example, the vibrator 5 may be a mesa-type vibrator in which a vibration region sandwiched between the excitation electrodes 52 and 53 protrudes from the portion around the vibration region or may conversely be an inverted-mesa-type vibrator in which the vibration region is recessed from the portion therearound. The vibration substrate 50 may undergo a beveling process of grinding a peripheral portion thereof or a convex-shape forming process of producing convexly curved upper and lower surfaces. The vibrator 5 is not limited to a vibrator that vibrates in the thickness-shear vibration mode. For example, the vibrator 5 may be a tuning-fork-shaped vibrator having a plurality of vibration arms that undergo bending vibration in the in-plane direction, a tuning-fork-shaped vibrator having a plurality of vibration arms that undergo bending vibration in the out-of-plane direction, a gyro sensor device having a driving arm that undergoes driving vibration and a detection arm that undergoes detection vibration to detect angular velocity, or an acceleration sensor device including a detector that detects acceleration. The vibration substrate 50 is not necessarily formed of an AT-cut quartz substrate and may instead be formed of a quartz substrate other than an AT-cut quartz substrate, for example, an X-cut quartz substrate, a Y-cut quartz substrate, a Z-cut quartz substrate, a BT-cut quartz substrate, an SC-cut quartz substrate, or an ST-cut quartz substrate. In the present embodiment, the vibration substrate 50 is made of quartz, but not necessarily, and may instead be made, for example, of lithium niobate, lithium tantalate, lithium tetraborate, potassium niobate, gallium phosphate, or any other piezoelectric single crystal or piezoelectric single crystal other than the substances described above. The vibrator 5 is not limited to a piezoelectrically driven vibrator and may be an electrostatically driven vibrator using electrostatic force.

Figure 8:
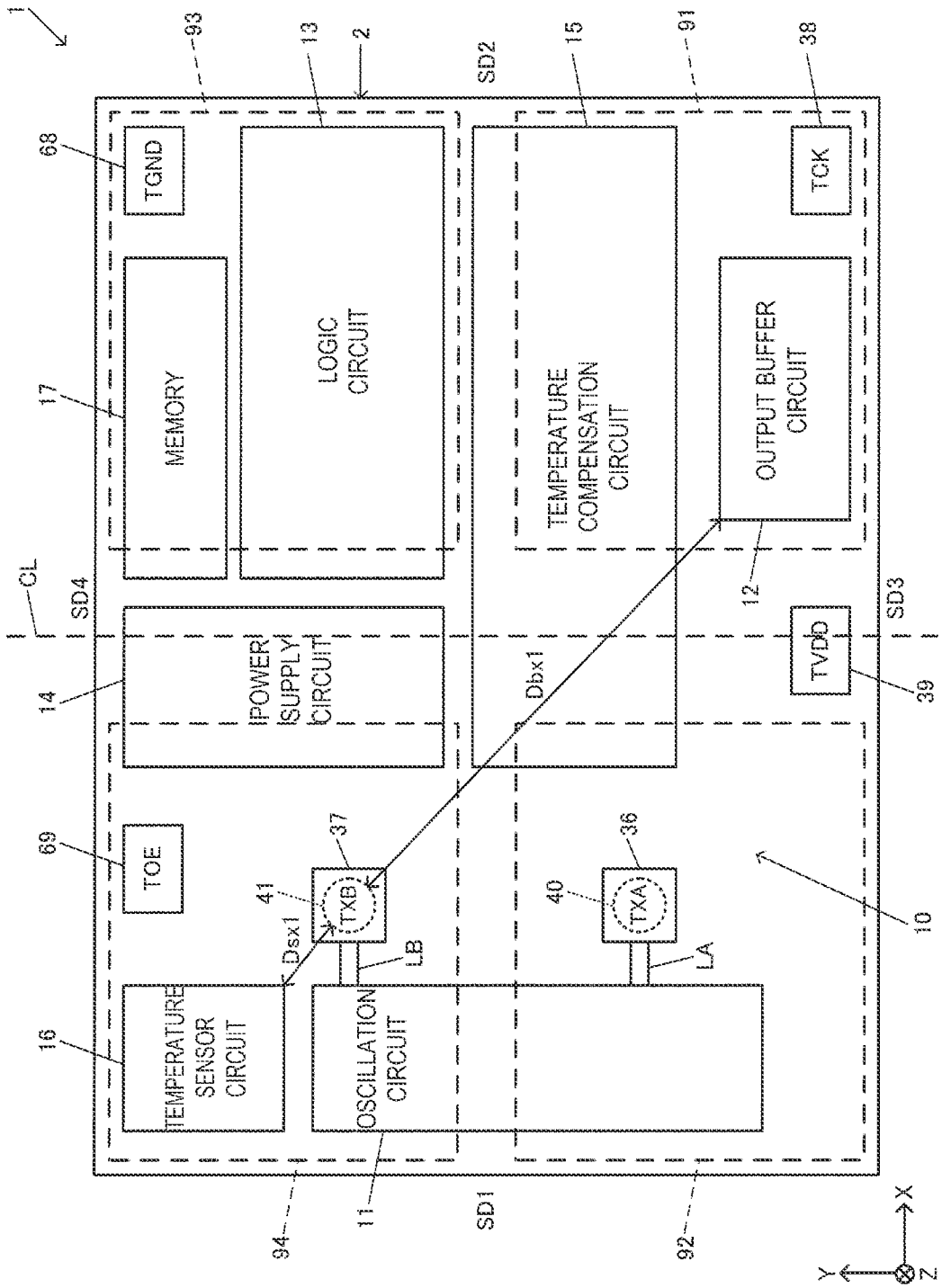
FIG. 8 is a plan view showing the arrangement of the output buffer circuit, a temperature sensor circuit, and through electrodes.

The vibrator 5 is fixed to the first surface 21, which is the upper surface of the semiconductor substrate 20, via the electrically conductive joining member 60 and another electrically conductive joining member 61, as shown in FIGS. 2 and 3. Although not shown in FIG. 2, the two joining members 60 and 61 are provided, for example, along the axis-Y direction, as shown in FIG. 3. Furthermore, the semiconductor substrate 20 is provided, for example, with two through electrodes, that is, the through electrode 40 and another through electrode 41, along the axis-Y direction, as shown in FIG. 8, which will be described later, and other figures, and the through electrodes 40 and 41 are electrically coupled to the vibrator 5 via the electrically conductive joining members 60 and 61. One of the through electrodes 40 and 41 is a first through electrode, and the other one of the through electrodes 40 and 41 is a second through electrode. Specifically, one end of the through electrode 40 is electrically coupled to the excitation electrode 52 of the vibrator 5 via the joining member 60, and the terminal 56 and the wiring line 54 of the vibrator 5. One end of the through electrode 41 is electrically coupled to the excitation electrode 53 of the vibrator 5 via the joining member 61, and the terminal 57 and the wiring line 55 of the vibrator 5. The other ends of the through electrodes 40 and 41 are electrically coupled to the integrated circuit 10. The vibrator 5 and the integrated circuit 10 are thus electrically coupled to each other via the through electrodes 40 and 41. Specifically, the other ends of the through electrodes 40 and 41 are electrically coupled to an oscillation circuit 11 of the integrated circuit 10 via the contact pad 36 and another contact pad 37 shown in FIGS. 2 and 8 and other figures. The vibrator 5 and the oscillation circuit 11 are thus electrically coupled to each other via the through electrodes 40 and 41.

The joining members 60 and 61 are not particularly limited to specific members as long as they have both electrical conductivity and joinability and can be achieved by any of a variety of electrically conductive bumps 62, such as gold bumps, silver bumps, copper bumps, solder bumps, and resin core bumps. Instead, the joining members 60 and 61 may each, for example, be an electrically conductive adhesive, such as any of a variety of polyimide-based, epoxy-based, silicone-based, and acrylic adhesives with electrically conductive fillers, such as silver fillers, dispersed therein. Using the electrically conductive bump 62 as each of the joining members 60 and 61 allows suppression of gases produced from the joining members 60 and 61 and effective suppression of a change in the environment in the accommodation space SP, in particular, an increase in pressure therein. On the other hand, when the electrically conductive adhesive is used as the joining members 60 and 61, the joining members 60 and 61 are softer than the case where they are each the electrically conductive bump 62, so that stress induced in the joining members 60 and 61 is unlikely to be transmitted to the vibrator 5.

The semiconductor substrate 20 is thermally oxidized, after the through holes are formed, to form insulating layers 44, which are each an insulating film made, for example, of silicon oxide ($SiO_2$), at the first surface 21 of the semiconductor substrate 20 and at the inner surfaces of the through holes. Forming the insulating layers 44 by thermal oxidation allows dense, homogeneous insulating layers 44 to be formed at the surface of the semiconductor substrate 20. The difference in the coefficient of linear expansion between the insulating layers 44 and the semiconductor substrate 20 can also be reduced. Thermal stress is therefore unlikely to occur, and a vibration device 1 having excellent oscillation characteristics can be achieved. The insulating layers 44 are not necessarily made of a specific material and may be made, for example, of silicon nitride (SiN) or resin. The method of forming the insulating layers 44 is not limited to thermal oxidation and may instead, for example, be chemical vapor deposition (CVD).

The through electrodes 40 and 41 are then formed by filling the spaces inside the insulating layers 44 in the through holes with an electrically conductive material, such as copper or electrically conductive polysilicon. That is, the through holes 40 and 41 are formed by filling the interiors of the through holes with an electrically conductive material. One-side ends of the through electrodes 40 and 41 are electrically coupled to the vibrator 5. Specifically, the one-side ends of the through electrodes 40 and 41 are electrically coupled to the excitation electrodes 52 and 53 of the vibrator 5, respectively. On the other hand, the other-side ends of the through electrodes 40 and 41 are electrically coupled to the integrated circuit 10. Specifically, the other-side ends of the through electrodes 40 and 41 are electrically coupled to the oscillation circuit 11 of the integrated circuit 10 via the contact pads 36 and 37.

The integrated circuit 10 is formed, for example, of an N-type transistor 23 and a P-type transistor 24, as shown in FIG. 2. The transistors 23 and 24 are each formed of the source and drain regions, which are the diffusion regions formed in the semiconductor substrate 20, a gate electrode, and a gate oxide film. The transistors 23 and 24 are separated from each other by a device separation film 25 called LOCOS (LOCal Oxidation of Silicon). The integrated circuit 10 further includes a wiring layer 30, which achieves the connection wiring lines between the plurality of circuit elements, such as the transistors 23 and 24. For example, the wiring layer 30 in FIG. 2 includes metal layers 31 and 32 and insulating layers 33, 34, and 35. The metal layers 31 and 32 are first and second metal layers, respectively, and the insulating layers 33, 34, and 35 are first, second, and third insulating layers, respectively. The metal layer 31 is formed between the insulating layers 33 and 34, and the metal layer 32 is formed between the insulating layers 34 and 35. The metal layers 31 and 32 are achieved, for example, by metal, such as aluminum. The uppermost insulating layer 35 forms a passivation film. The metal layers 31 and 32 are electrically coupled to each other via contacts called via contacts, and the metal layer 31 is electrically coupled to the source and drain regions of the transistors 23 and 24 via contacts. The contact pad 36, which is electrically coupled to the other-side ends of the through electrodes 40 and 41, is formed by the underlying metal layer 31, as shown in FIG. 2. The contact pads 38 and 39, which are electrically coupled to the external connection terminals 91 and 92, are formed by the overlying metal layer 32. In the wiring layer 30, a layer close to the transistors 23 and 24 in the integrated circuit 10 is called a lower layer, and a layer far from the transistors 23 and 24 in the integrated circuit 10 is called an upper layer. FIG. 2 shows the case where the wiring layer 30 includes the two metal layers 31 and 32, but not necessarily in the present embodiment, and the wiring layer 30 may include three or more metal layers. In this case, the contact pads 36 and 37 are formed by the lowermost metal layer of the plurality of metal layers, and the contact pads 38 and 39 are formed by the uppermost metal layer of the plurality of metal layers. The uppermost insulating layer forms a passivation film.

The relocation wiring layer 8 includes the insulating layer 80 achieved by a resin layer made, for example, of polyimide, and the wiring lines 82 achieved, for example, by copper foil. The contact pad 38 is electrically coupled to the external connection terminal 91, and the contact pad 39 is electrically coupled to the external connection terminal 92 via the wiring lines 82.

In FIG. 2, the external connection terminals 91 and 92 each have a two-layer structure including a first metal layer 101 and a second metal layer 102. The first metal layer 101 at the side facing the insulating layer 80 made of polyimide is, for example, a titanium tungsten layer to improve adhesion to the polyimide. The second metal layer 102 is a metal layer made, for example, of copper or gold, which can be easily soldered or otherwise attached, for example, to external terminals or wiring lines.

Figure 4:
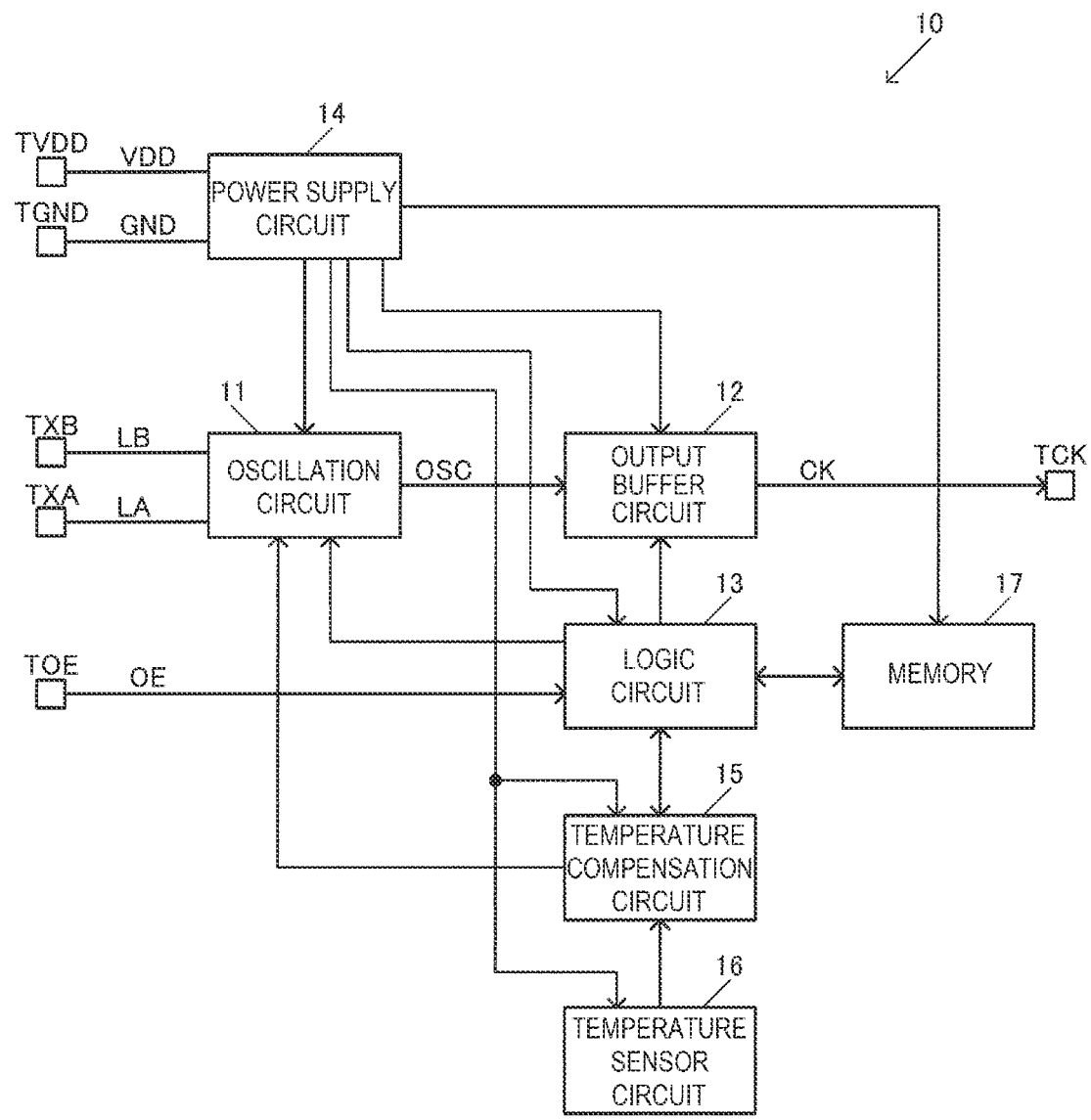
FIG. 4 shows an example of the configuration of an integrated circuit.

FIG. 4 shows an example of the configuration of the integrated circuit 10. The integrated circuit 10 includes the oscillation circuit 11, an output buffer circuit 12, a temperature compensation circuit 15, and a temperature sensor circuit 16. The integrated circuit 10 can further include a logic circuit 13, a power supply circuit 14, and a memory 17.

The oscillation circuit 11 is a circuit that causes the vibrator 5 to oscillate. For example, the oscillation circuit 11 is electrically coupled to terminals TXA and TXB and generates an oscillation signal OSC. Specifically, the oscillation circuit 11 is electrically coupled to the vibrator 5 via wiring lines LA and LB and the terminals TXA and TXB and generates the oscillation signal OSC by causing the vibrator 5 to oscillate. One of the terminals TXA and TXB is a first terminal, and the other one of the terminals TXA and TXB is a second terminal. For example, the oscillation circuit 11 can be achieved by a drive circuit for oscillation provided between the terminals TXA and TXB and passive elements, such as capacitors and resistors. The drive circuit can be achieved, for example, by a CMOS inverter circuit or a bipolar transistor. The drive circuit is a core circuit of the oscillation circuit 11, and the drive circuit causes the vibrator 5 to oscillate by driving the vibrator 5 with voltage or current. The oscillation circuit 11 can be any of a variety of types of oscillation circuit, such as an inverter-type oscillation circuit, a Pierce-type oscillation circuit, a Colpitts-type oscillation circuit, and a Hartley-type oscillation circuit. The oscillation circuit 11 is provided with a variable capacitance circuit, and the oscillation frequency of the oscillation circuit 11 can be adjusted by adjusting the capacitance of the variable capacitance circuit. The variable capacitance circuit can be achieved by a variable capacitance element, such as a varactor. Instead, the variable capacitance circuit may be achieved by a capacitor array and a switch array coupled to the capacitor array. For example, the variable capacitance circuit may be formed of the following two arrays: a capacitor array including a plurality of capacitors having binary-weighted capacitance values; and a switch array including a plurality of switches that each turn on and off the coupling between the corresponding capacitor of the capacitor array and the terminal TXA or TXB. Note that the coupling in the present embodiment is electrical coupling. The electrical coupling is coupling that allows transmission of an electric signal and hence transmission of information in the form of the electric signal. The electrical coupling may be coupling, for example, via an active element.

The output buffer circuit 12 outputs a clock signal CK based on the oscillation signal OSC. For example, the output buffer circuit 12 buffers the oscillation signal OSC and outputs the oscillation signal OSC as the clock signal CK to a terminal TCK. The clock signal CK is then outputted out of the vibration device 1 via the external connection terminal 91 of the vibration device 1. For example, the output buffer circuit 12 outputs the clock signal CK in the form of a single-ended CMOS signal. For example, when an output enable signal OE from a terminal TOE is active, an enable signal from the logic circuit 13 becomes active, and the output buffer circuit 12 outputs the clock signal CK that is the buffered oscillation signal OSC. On the other hand, when the output enable signal OE is inactive, the output buffer circuit 12 sets the clock signal CK at a fixed voltage level, for example, the low level. The voltage level at the terminal TCK is thus set at the fixed voltage level. The state in which a signal is active means that the signal has the high level in the case of positive logic and has the low level in the case of negative logic. The state in which a signal is inactive means that the signal has the low level in the case of positive logic and has the high level in the case of negative logic. The output buffer circuit 12 may be configured to output the clock signal CK in the form of a non-CMOS signal.

The logic circuit 13 is a control circuit and performs a variety of types of control. For example, the logic circuit 13 controls the entire integrated circuit 10 or controls the action sequence of the integrated circuit 10. The logic circuit 13 may further carry out a variety of processes of controlling the oscillation circuit 11 and control the power supply circuit 14. The logic circuit 13 can, for example, be achieved by an ASIC (application specific integrated circuit) produced by automatically placed wiring lines, such as a gate array.

The power supply circuit 14 receives power supply voltage VDD supplied via a terminal TVDD and ground voltage GND supplied via a terminal TGND. The power supply circuit 14 then supplies the internal circuits of the integrated circuit 10 with power supply voltage for the internal circuits. The power supply circuit 14 may generate reference voltage, reference current, or any other physical quantity used in the integrated circuit 10. For example, the power supply circuit 14 includes a regulator and supplies the oscillation circuit 11, the output buffer circuit 12, and the logic circuit 13 with regulated voltage generated by the regulator. In this case, the power supply circuit 14 may include a regulator that generates regulated voltage supplied to the oscillation circuit 11 and a regulator that generates regulated voltage supplied to the output buffer circuit 12 and the logic circuit 13.

The temperature compensation circuit 15 performs temperature compensation on the oscillation signal OSC from the oscillation circuit 11. The temperature compensation performed on the oscillation signal OSC is temperature compensation performed on the oscillation frequency of the oscillation circuit 11. The output buffer circuit 12 then outputs the clock signal CK based on the temperature compensated oscillation signal OSC. Specifically, the temperature compensation circuit 15 performs the temperature compensation based on temperature detection information from the temperature sensor circuit 16. For example, the temperature compensation circuit 15 generates temperature compensation voltage based on temperature detection voltage from the temperature sensor circuit 16 and outputs the generated temperature compensation voltage to the oscillation circuit 11 to perform the temperature compensation on the oscillation signal OSC from the oscillation circuit 11. For example, the temperature compensation circuit 15 performs the temperature compensation by outputting the temperature compensation voltage, which serves as voltage that controls the capacitance of the variable capacitance circuit provided in the oscillation circuit 11, to the variable capacitance circuit. In this case, the variable capacitance circuit in the oscillation circuit 11 is achieved by a variable capacitance element, such as a varactor. The temperature compensation is the process of suppressing variation in the oscillation frequency caused by variation in the temperature to compensate for the variation. For example, the temperature compensation circuit 15 performs analog temperature compensation using polynomial approximation. For example, when the temperature compensation voltage that compensates for variation in the frequency-temperature characteristics of the vibrator 5 is approximately expressed by a polynomial, the temperature compensation circuit 15 performs analog temperature compensation based on information on the coefficients of the polynomial. The analog temperature compensation is temperature compensation achieved, for example, by addition of a current or voltage signal, which is an analog signal. Specifically, the memory 17 stores the information on the coefficients of the polynomial for temperature compensation, and the logic circuit 13 reads the coefficient information from the memory 17 and sets the coefficient information, for example, in a register of the temperature compensation circuit 15. The temperature compensation circuit 15 then performs the analog temperature compensation based on the coefficient information set in the register.

The temperature compensation circuit 15 may perform digital temperature compensation. In this case, the temperature compensation circuit 15 is achieved, for example, by a logic circuit. Specifically, the temperature compensation circuit 15 performs the digital temperature compensation based on temperature detection data that is the temperature detection information from the temperature sensor circuit 16. For example, the temperature compensation circuit 15 determines frequency adjustment data based on the temperature detection data. The capacitance value of the variable capacitance circuit in the oscillation circuit 11 is then adjusted based on the determined frequency adjustment data. The temperature compensation is thus performed on the oscillation frequency of the oscillation circuit 11. In this case, the variable capacitance circuit in the oscillation circuit 11 is achieved by a capacitor array including a plurality of binary weighted capacitors and a switch array. The memory 17 stores a lookup table representing the correspondence between temperature detection data and the frequency adjustment data, and the temperature compensation circuit 15 performs the temperature compensation process of determining the frequency adjustment data from the temperature data by using the lookup table read by the logic circuit 13 from the memory 17.

The temperature sensor circuit 16 is a sensor circuit that detects the temperature. Specifically, the temperature sensor circuit 16 outputs a temperature-dependent voltage that changes in accordance with the ambient temperature as the temperature detection voltage. For example, the temperature sensor circuit 16 uses a circuit element having a temperature dependence to generate the temperature detection voltage. Specifically, the temperature sensor circuit 16 uses the temperature dependence of the forward voltage of a PN junction to output the temperature detection voltage that changes depending on the temperature. The forward voltage of a PN junction can, for example, be the base-emitter voltage of a bipolar transistor.

To perform the digital temperature compensation, the temperature sensor circuit 16 measures the temperature, such as the ambient temperature, and outputs the result of the measurement as the temperature detection data. The temperature detection data is, for example, data that monotonously increases or decreases with temperature. The temperature sensor circuit 16 in this case can be a temperature sensor circuit that utilizes the fact that the oscillation frequency of a ring oscillator has a temperature dependence. Specifically, the temperature sensor circuit 16 includes a ring oscillator and a counter circuit. The counter circuit counts an output pulse signal that is the oscillation signal from the ring oscillator over a counting period of time specified by the clock signal based on the oscillation signal OSC from the oscillation circuit 11 and outputs the count as the temperature detection data.

The memory 17 stores a variety of pieces of information used in the integrated circuit 10. The memory 17 can be achieved, for example, by a nonvolatile memory. The nonvolatile memory is an EEPROM, such as an FAMOS (floating gate avalanche injection MOS) memory or an MONOS (metal-oxide-nitride-oxide-silicon) memory, but not necessarily, and may, for example, be an OTP (one time programmable) memory or a fuse-type ROM. Instead, the memory 17 may be achieved by a volatile memory, such as a RAM.

The terminals TXA and TXB in FIG. 4 are achieved by the contact pads 36 and 37 in FIGS. 2 and 8 and other figures. That is, the oscillation circuit 11 is electrically coupled to the vibrator 5 via the terminals TXA and TXB achieved by the contact pads 36 and 37. The terminal TCK is achieved by the contact pad 38. That is, the clock signal CK from the output buffer circuit 12 is outputted via the terminal TCK achieved by the contact pad 38 and exits out of the external connection terminal 91. The terminals TVDD and TGND are achieved by the contact pad 39 shown, for example, in FIG. 2 and a contact pad 68 shown, for example, in FIG. 8, respectively. That is, the power supply voltage VDD and the ground voltage GND are supplied to the integrated circuit 10 via the terminals TVDD and TGND achieved by the contact pads 39 and 68. Specifically, VDD and GND are supplied to the power supply circuit 14. The terminal TOE is achieved by a contact pad 69. That is, the output enable signal OE is inputted to the integrated circuit 10 via the terminal TOE achieved by the contact pad 69. For example, the output enable signal OE is inputted to the logic circuit 13.

Figure 5:
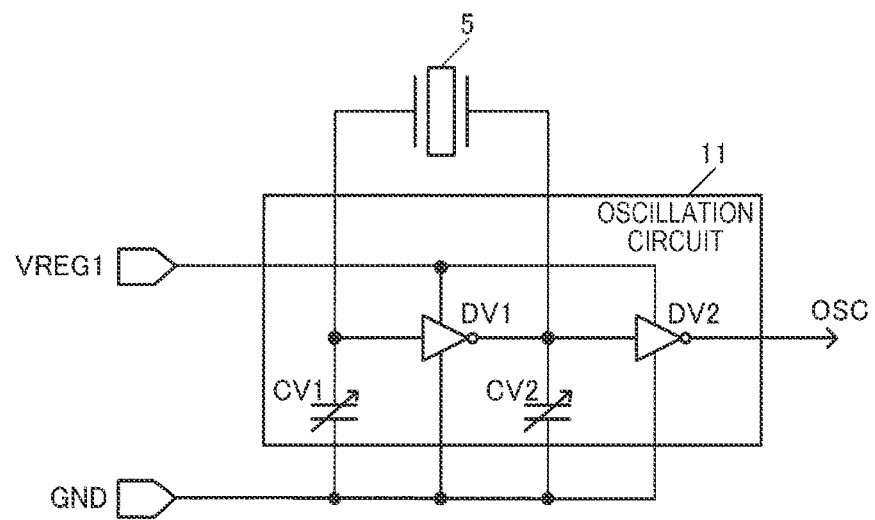
FIG. 5 shows an example of the configuration of an oscillation circuit.

FIG. 5 shows an example of the configuration of the oscillation circuit 11. The oscillation circuit 11 includes inverter circuits DV1 and DV2 and variable capacitance circuits CV1 and CV2, as shown in FIG. 5. The inverter circuit DV1 is a drive circuit that drives the vibrator 5, and the inverter circuit DV1 has an input node coupled to one end of the vibrator 5 and an output node coupled to the other end of the vibrator 5. The inverter circuit DV2 buffers an output signal from the inverter circuit DV1 and outputs the output signal as the oscillation signal OSC. The inverter circuits DV1 and DV2 operate when regulated power supply voltage VREG1 and the ground voltage GND are supplied thereto. The regulated power supply voltage VREG1 is generated by the regulator provided in the power supply circuit 14.

The variable capacitance circuit CV1 has one end coupled to the one end of the vibrator 5 and the other end coupled to a GND node. The variable capacitance circuit CV2 has one end coupled to the other end of the vibrator 5 and the other end coupled to GND. The variable capacitance circuits CV1 and CV2 may each be achieved by a variable capacitance element having capacitance controlled by the capacitance control voltage, which is the temperature compensation voltage, such as a varactor, as described above, or achieved by a circuit that includes a capacitor array and a switch array and has capacitance value controlled by frequency control data.

Figure 6:
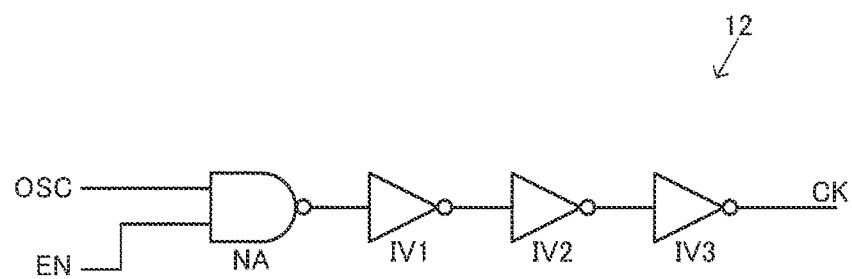
FIG. 6 shows an example of the configuration of an output buffer circuit.

FIG. 6 shows an example of the configuration of the output buffer circuit 12. The output buffer circuit 12 includes a NAND circuit NA and inverter circuits IV1, IV2, and IV3, as shown in FIG. 6. The output buffer circuit 12 is thus formed of a buffer circuit, for example, a plurality of signal inversion circuits. The oscillation signal OSC, which is the oscillation clock signal from the oscillation circuit 11, is inputted to a first input node of the NAND circuit NA, and an enable signal EN from the logic circuit 13 is inputted to a second input node of the NAND circuit NA. For example, when the output enable signal OE inputted via the terminal TOE has the high level, which is the active level, the enable signal EN has the high level, and the oscillation signal OSC is buffered by the NAND circuit NA and the inverter circuits IV1, IV2, and IV3 and is outputted as the clock signal CK. On the other hand, when the output enable signal OE inputted via the terminal TOE has the low level, which is the inactive level, the enable signal EN has the low level, and the output from the output buffer circuit 12 is fixed at the low level.

Figure 7:
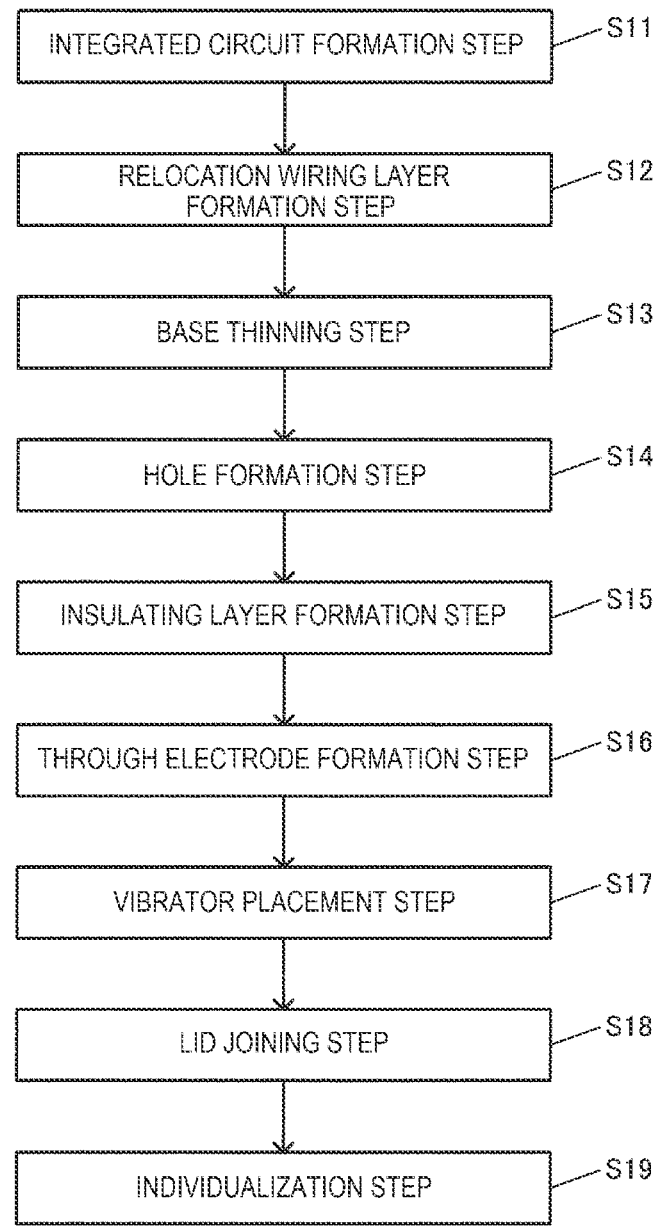
FIG. 7 is a manufacturing step diagram showing an example of a method for manufacturing the vibration device.

A method for manufacturing the vibration device 1 according to the present embodiment will next be described. FIG. 7 is a manufacturing step diagram showing an example of the method for manufacturing the vibration device 1.

In an integrated circuit formation step (S11), the semiconductor substrate 20 is prepared, and the integrated circuit 10 is formed at the second surface 22, which is the lower surface of the semiconductor substrate 20, as shown in FIGS. 1 and 2. In a relocation wiring layer formation step (S12), the relocation wiring layer 8 including, for example, the insulating layer 80, the wiring lines 82, and the external connection terminals 91 and 92 is formed to electrically couple the contact pads 38 and 39 and other contact pads of the integrated circuit 10 to the external connection terminals 91 and 92 and other terminals. In a base thinning step (S13), the first surface 21, which is the mounting surface of the semiconductor substrate 20, which is the surface on which the vibrator 5 is mounted, is polished to thin the base 2. That is, the base 2 is thinned.

In a hole formation step (S14), the through holes are formed. Specifically, holes are formed by dry etching in the semiconductor substrate 20, and the holes are extended by wet etching to the metal layer 31, which is the first metal layer, of the wiring layer 30 in FIG. 2. In an insulating layer formation step (S15), the semiconductor substrate 20 is thermally oxidized to form the insulating layers 44, which are insulating films made of silicon oxide ($SiO_2$) or resin, at the surface of the semiconductor substrate 20, particularly at the inner surfaces of the through holes. In a through electrode formation step (S16), the interiors of the through holes are filled with an electrically conductive material, such as copper, to form the through electrodes 40 and 41. In a vibrator placement step (S17), the vibrator 5 is prepared and joined to the first surface 21 of the semiconductor substrate 20 via the joining members 60 and 61. In a lid joining step (S18), the lid 7 is prepared and joined to the base 2 via the joining members 71 and 72 in a depressurized environment. In an individualization step (S19), the entire structure is individualized into the vibration devices 1, for example, with a dicing saw. The vibration devices 1 are thus produced.

As described above, in the present embodiment, a first semiconductor wafer in which a plurality of bases 2, which each include the vibrator 5 and the integrated circuit 10, are formed and a second semiconductor wafer in which a plurality of lids 7 are formed are bonded to each other so that the plurality of bases 2 and the plurality of lids 7 are joined to each other. The integrated vibration devices 1 are then separated into individual pieces to manufacture a large number of vibration devices 1. For example, compact vibration devices 1 each having longitudinal and lateral dimensions ranging from 1 millimeter to several millimeters and a thickness smaller than 1 mm are manufactured. The vibration devices 1 in the form of a wafer-level package (WLP) can thus be achieved and manufactured at high throughput and at low cost. That is, the vibration devices 1 each including the vibrator 5 and the integrated circuit 10 can be collectively manufactured in a wafer-level batch process.

2. Arrangement of through Electrodes and Output Buffer Circuit

Figure 9:
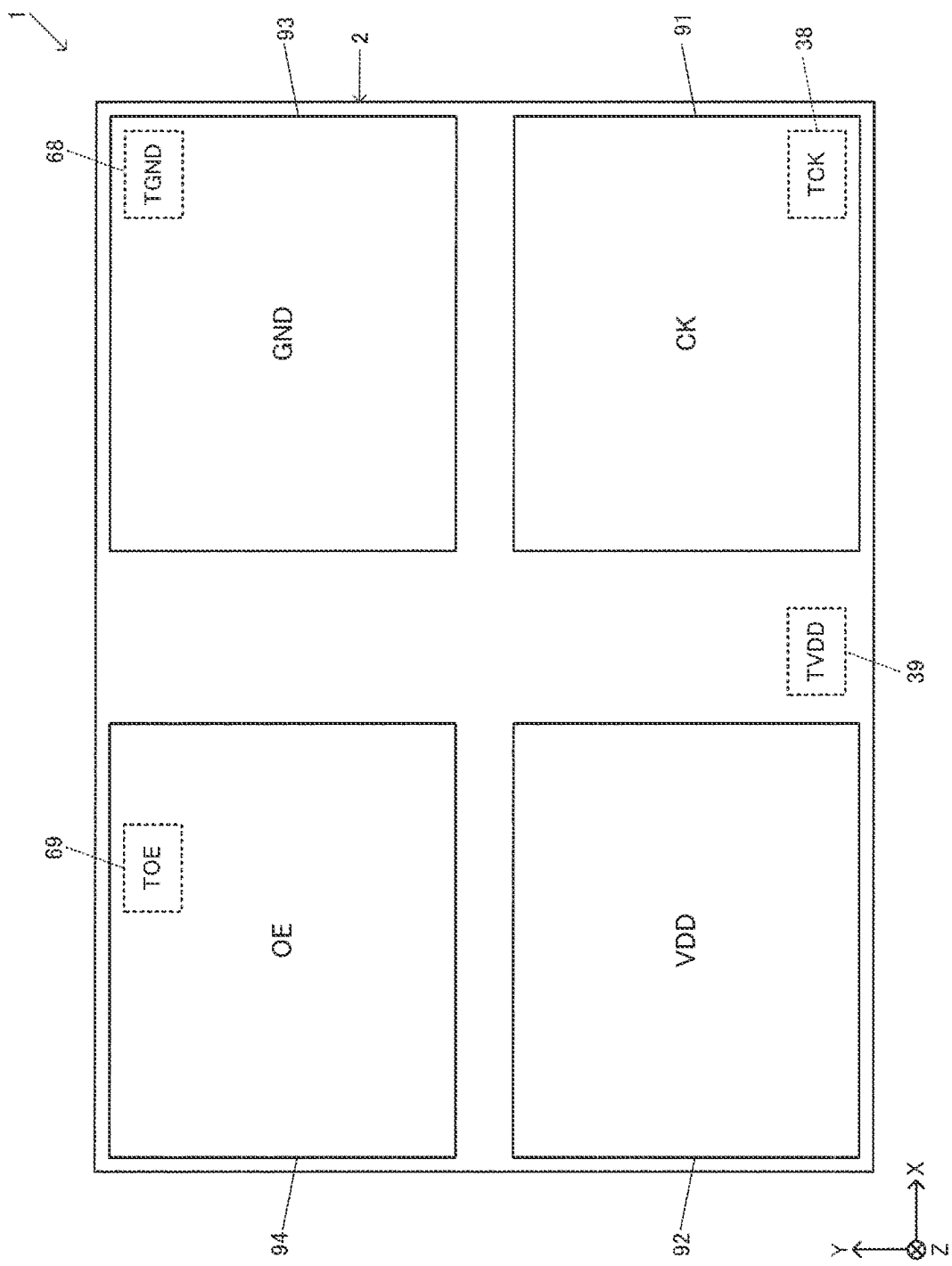
FIG. 9 is a plan view showing an example of the arrangement of outer connection terminals.

FIG. 8 is a plan view showing the arrangement of the output buffer circuit 12, the temperature sensor circuit 16, and the through electrodes 40 and 41 in the vibration device 1 according to the present embodiment. FIG. 8 further shows the relationship between the positions where the circuits in the integrated circuit 10 are placed and the positions where the through electrodes 40 and 41 and the external connection terminals 91, 92, 93, and 94 are placed. FIG. 8 is a plan view of the base 2 viewed from the negative side in the axis-Z direction and shows dotted lines that indicate the external shapes of the through electrodes 40 and 41 located on the positive side in the axis-Z direction with respect to the base 2, where the integrated circuit 10 is formed, and the external shapes of the external connection terminals 91, 92, 93, and 94 located on the negative side in the axis-Z direction with respect to the base 2. FIG. 9 shows the positions where the external connection terminals 91, 92, 93, and 94 are placed at the bottom surface of the vibration device 1 and is a plan view of the bottom surface of the vibration device 1 viewed from the negative side in the axis-Z direction. In FIGS. 8 and 9, the external connection terminals 91, 92, 93, and 94 each have a rectangular shape, but the terminals do not need to be exactly rectangular. For example, the terminals may each have chamfered corners or a shape other than a rectangular shape.

As described above, the vibration device 1 according to the present embodiment includes the base 2 including the semiconductor substrate 20 and the through electrode 40 passing through the portion between the first surface 21 and the second surface 22 of the semiconductor substrate 20, and the vibrator 5 fixed to the first surface 21 of the semiconductor substrate 20 via the electrically conductive joining members 60 and 61. The oscillation circuit 11, the temperature compensation circuit 15, the temperature sensor circuit 16, and the output buffer circuit 12 are placed at the second surface 22 of the semiconductor substrate 20, as shown in FIG. 8. The oscillation circuit 11 is electrically coupled to the vibrator 5 via the through electrodes 40 and 41 and generates the oscillation signal OSC by causing the vibrator 5 to oscillate. The temperature compensation circuit 15 performs the temperature compensation on the oscillation signal OSC based on the output from the temperature sensor circuit 16. For example, the temperature compensation circuit 15 generates the temperature compensation voltage based on the temperature detection voltage, which is the output from the temperature sensor circuit 16, and adjusts the capacitance value of the variable capacitance circuit in the oscillation circuit 11 to perform the temperature compensation on the oscillation signal OSC. Instead, the temperature compensation circuit 15 determines the frequency adjustment data based on the temperature detection data, which is the output from the temperature sensor circuit 16, and adjusts the capacitance value of the variable capacitance circuit in the oscillation circuit 11 based on the determined frequency adjustment data to perform the temperature compensation on the oscillation signal OSC. The output buffer circuit 12 then outputs the clock signal CK based on the temperature compensated oscillation signal OSC. For example, the oscillation signal OSC having undergone the temperature compensation performed by the temperature compensation circuit 15 is buffered by the output buffer circuit 12 and outputted as the clock signal CK. For example, the clock signal CK from the output buffer circuit 12 is outputted via the contact pad 38 and exits out of the vibration device 1 via the external connection terminal 91. Since the output buffer circuit 12 is a circuit that drives an external load of the vibration device 1, current having, for example, a magnitude of 10 mA or greater may flow through the output buffer circuit 12 when the external load is driven, so that the output buffer circuit 12 generates a very large amount of heat.

Now, let Dbx1 be the distance between the output buffer circuit 12 and the through electrode 41 and Dsx1 be the distance between the temperature sensor circuit 16 and the through electrode 41, as shown in FIG. 8. The distance Dbx1 is the shortest distance among the lengths of the line segments that connect arbitrary points in the region of the output buffer circuit 12 to arbitrary points in the region of the through electrode 41. The distance Dsx1 is the shortest distance among the lengths of the line segments that connect arbitrary points in the region of the temperature sensor circuit 16 to arbitrary points in the region of the through electrode 41. In the present embodiment, the relationship Dsx1 <Dbx1 is satisfied, as shown in FIG. 8. That is, the distance Dsx1 between the temperature sensor circuit 16 and the through electrode 41 is smaller than the distance Dbx1 between the output buffer circuit 12 and the through electrode 41, which means that the temperature sensor circuit 16 is placed in a position closer to the through electrode 41 than the output buffer circuit 12. That is, in the configuration in which the vibrator 5 is coupled and fixed to the semiconductor substrate 20, at which the oscillation circuit 11, the output buffer circuit 12, the temperature compensation circuit 15, and the temperature sensor circuit 16 are formed, the temperature sensor circuit 16 is placed in a position closer to the through electrode 41 than the output buffer circuit 12 in the circuit layout of the semiconductor substrate 20. For example, the temperature sensor circuit 16 is placed so as to be adjacent to the through electrode 41 in the plan view viewed in the direction perpendicular to the first surface 21. For example, the through electrode 41 and the temperature sensor circuit 16 are placed so as to be adjacent to each other in the plan view so that no other circuit blocks are interposed therebetween.

For example, in a temperature compensated oscillator of related art, in which a vibrator is accommodated in a first recess of a ceramic package and an IC chip is accommodated in a second recess, heat generated by an output buffer circuit of the IC chip is unlikely to be transferred to the vibrator. That is, the vibrator is not directly fixed to the IC chip, and the IC chip and vibrator are only electrically coupled to each other, for example, via internal wiring line in the package. The paths of the internal wiring lines are therefore unlikely to allow the heat generated by the output buffer circuit of the IC chip to be transmitted to the vibrator. Furthermore, since a ceramic material having thermal conductivity lower than that of a semiconductor substrate is interposed between the vibrator accommodated in the first recess of the ceramic package and the IC chip accommodated in the second recess, radiant heat from the IC chip is also unlikely to be transmitted to the vibrator. On the other hand, since a temperature sensor circuit is formed in the IC chip in which the output buffer circuit is formed, the heat generated by the output buffer circuit is immediately transmitted to the temperature sensor circuit. The temperature detected by the temperature sensor circuit therefore deviates from the actual temperature of the vibrator, and the deviation causes degradation in the oscillation characteristics, such as the oscillation frequency. For example, when the oscillator is activated, the heat generated by the output buffer circuit is immediately transmitted to the temperature sensor circuit in the IC chip in which the output buffer circuit and the temperature sensor circuit are both present, so that the temperature detected by the temperature sensor circuit immediately rises, while the heat generated by the output buffer circuit is unlikely to be transmitted to the vibrator, so that the actual temperature of the vibrator does not immediately rise. The temperature detected by the temperature sensor circuit therefore deviates from the actual temperature of the vibrator, resulting in degradation in the oscillation characteristics.

In contrast, in the present embodiment, the vibrator 5 is fixed to the semiconductor substrate 20 via the electrically conductive joining members 60 and 61, and the distance Dsx1 between the temperature sensor circuit 16 and the through electrode 41 is smaller than the distance Dbx1 between the output buffer circuit 12 and the through electrode 41. As described above, in the present embodiment, since the vibrator 5 is directly fixed to the semiconductor substrate 20 via the joining members 60 and 61, the heat generated by the output buffer circuit 12 is more likely to be transmitted to the vibrator 5 than in oscillators of related art using ceramic packages. That is, in the WLP vibration device 1 according to the present embodiment, the heat generated by the output buffer circuit 12 of the integrated circuit 10 is likely to be transmitted to the vibrator 5, so that the heat generated by the output buffer circuit 12 causes the temperature of the vibrator 5 also to rise in a short period of time. Furthermore, since no ceramic material having low thermal conductivity is present between the output buffer circuit 12 and the vibrator 5, the heat generated by the output buffer circuit 12 is likely to be transmitted also as radiant heat to the vibrator 5. On the other hand, since the distance Dsx1 between the temperature sensor circuit 16 and the through electrode 41 is small, the temperature sensor circuit 16 can detect the actual temperature of the vibrator 5, which has risen due to the heat generated by the output buffer circuit 12, in a short period of time. That is, the actual temperature of the vibrator 5 is transmitted to the integrated circuit 10 via the through electrode 41 having high thermal conductivity and other components, and the actual temperature can be detected in a short period of time by the temperature sensor circuit 16 placed at the short distance Dsx1 from the through electrode 41. For example, when the vibration device 1 is activated, the heat generated by the output buffer circuit 12 is transmitted to the vibrator 5 in a short period of time via the heat conduction path, causing the actual temperature of the vibrator 5 to rise, and the actual temperature of the vibrator 5 is detected via the through electrode 41 and other components by the temperature sensor circuit 16 placed in the vicinity of the through electrode 41. The temperature compensation circuit 15 then performs the temperature compensation based on the temperature detected by the temperature sensor circuit 16, whereby appropriate temperature compensation according to the actual temperature of the vibrator 5 is performed on the oscillation frequency. The occurrence of degradation in the oscillation characteristics caused by the deviation of the temperature detected by the temperature sensor circuit 16 from the actual temperature of the vibrator 5 can therefore be effectively suppressed.

Figure 10:
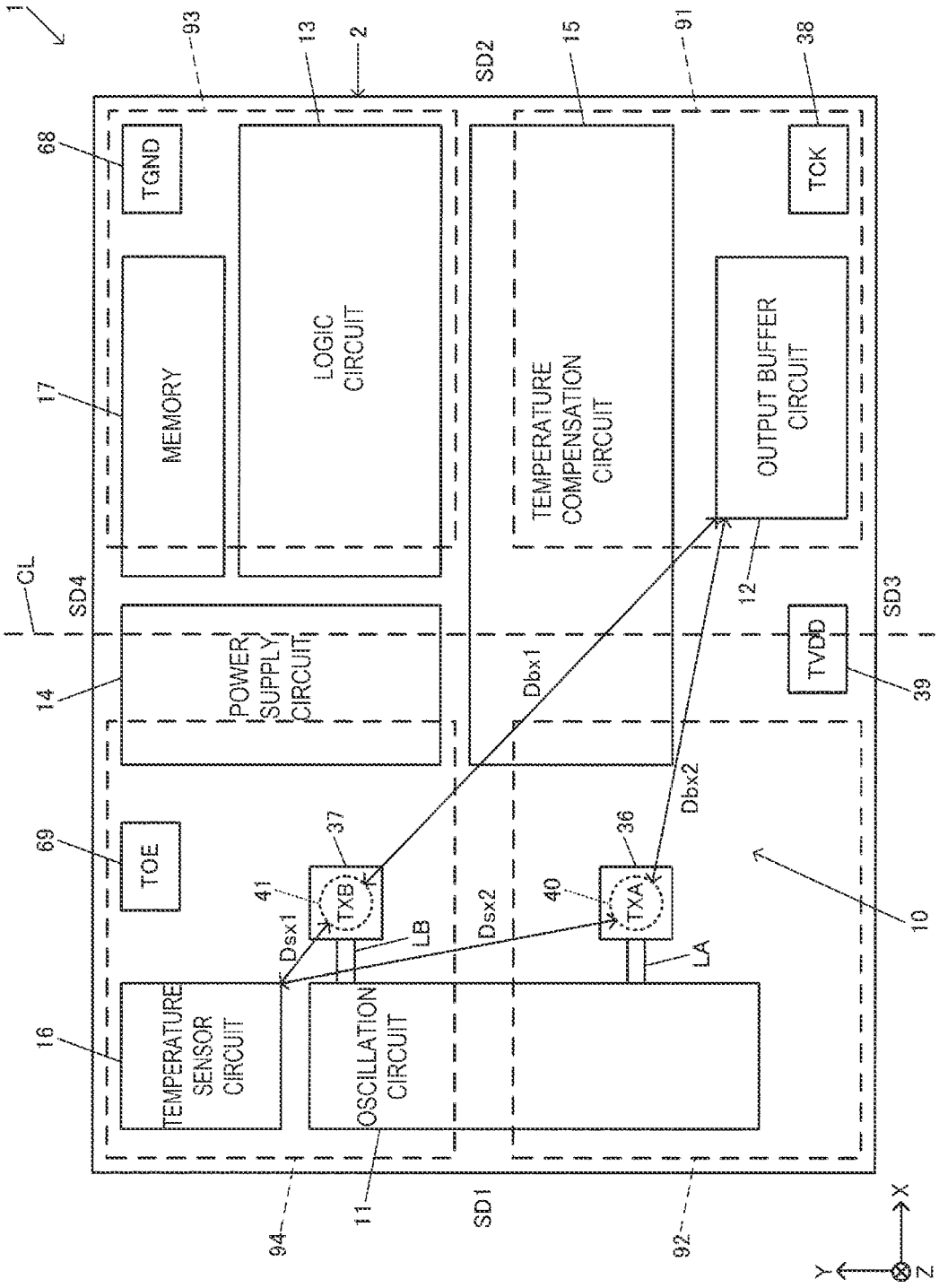
FIG. 10 is a plan view showing the arrangement of the output buffer circuit, the temperature sensor circuit, and through electrodes.

In the present embodiment, the base 2 includes the through electrode 41, which is the first through electrode, and the through electrode 40, which is the second through electrode. The oscillation circuit 11 is electrically coupled to the vibrator 5 via the through electrodes 41 and 40. Let Dbx1 be the distance between the output buffer circuit 12 and the through electrode 41, which is the first through electrode, and Dbx2 be the distance between the output buffer circuit 12 and the through electrode 40, which is the second through electrode, as shown in FIG. 10. Furthermore, let Dsx1 be the distance between the temperature sensor circuit 16 and the through electrode 41 and Dsx2 be the distance between the temperature sensor circuit 16 and the through electrode 40. Moreover, let Dsx be the shorter one of the distances Dsx1 between the temperature sensor circuit 16 and the through electrode 41 and Dsx2 between the temperature sensor circuit 16 and the through electrode 40. In FIG. 10, since the through electrode 41 is placed in a position closer to the temperature sensor circuit 16 than the through electrode 40, that is, Dsx1<Dsx2, so that Dsx=Dsx1 is satisfied. Under the definitions described above, Dsx<Dbx1 and Dsx<Dbx2 are satisfied in the present embodiment. That is, Dsx=Dsx1, which is the shorter distance between the temperature sensor circuit 16 and the through electrode 41, is shorter than the distance Dbx1 between the output buffer circuit 12 and the through electrode 41 and shorter than the distance Dbx2 between the output buffer circuit 12 and the through electrode 40.

That is, when the vibrator 5 and the integrated circuit 10 are electrically coupled to each other via the two through electrodes 40 and 41, the actual temperature of the vibrator 5 is transmitted to the integrated circuit 10 along the heat conduction path via the through electrode 41 and also along the heat conduction path via the through electrode 40. In FIG. 10, since the through electrode 41 is placed in a position closer to the temperature sensor circuit 16 than the through electrode 40, Dsx1<Dsx2 is satisfied. It is therefore important for quickest possible detection of the actual temperature of the vibrator 5, which rises due to the heat from the output buffer circuit 12, that the distance Dsx1 to the through electrode 41 close to the temperature sensor circuit 16 is short. To this end, under the definition that Dsx32 Dsx1 is the shorter one of the distance Dsx1 between the temperature sensor circuit 16 and the through electrode 41 and the distance Dsx2 between the temperature sensor circuit 16 and the through electrode 40, the relationship Dsx <Dbx1 and Dsx <Dbx2 should be established. When the relationship is satisfied, the distance Dsx1 to the through electrode 41, which is closer to the temperature sensor circuit 16, decreases, whereby the temperature sensor circuit 16 located in the vicinity of the through electrode 41 can detect in a short period of time the actual temperature of the vibrator 5, which is transmitted along the heat conduction path via the through electrode 41. The occurrence of degradation in the oscillation characteristics caused by the deviation of the temperature detected by the temperature sensor circuit 16 from the actual temperature of the vibrator 5 can therefore be suppressed.

In the above description, the through electrode 41 electrically coupled to the excitation electrode 53 at the lower surface of the vibration substrate 50 in FIG. 3 is the first through electrode, and the through electrode 40 electrically coupled to the excitation electrode 52 at the upper surface of the vibration substrate 50 is the second through electrode, but not necessarily in the present embodiment. For example, the through electrode 40 electrically coupled to the excitation electrode 52 at the upper surface may be the first through electrode, and the through electrode 41 electrically coupled to the excitation electrode 53 at the lower surface may be the second through electrode.

In the present embodiment, the base 2 has an edge SD1 and an edge SD2 facing the edge SD1. The edge SD1 is a first edge, and the edge SD2 is a second edge. The base 2 further has an edge SD3 and an edge SD4 facing the edge SD3. The edge SD3 is a third edge, and the edge SD4 is a fourth edge. For example, the base 2 has a rectangular shape having the edges SD1, SD2, SD3, and SD4 in the plan view. The rectangular shape does not need to be exactly rectangular. For example, the rectangular shape may have chamfered corners.

Figure 11:
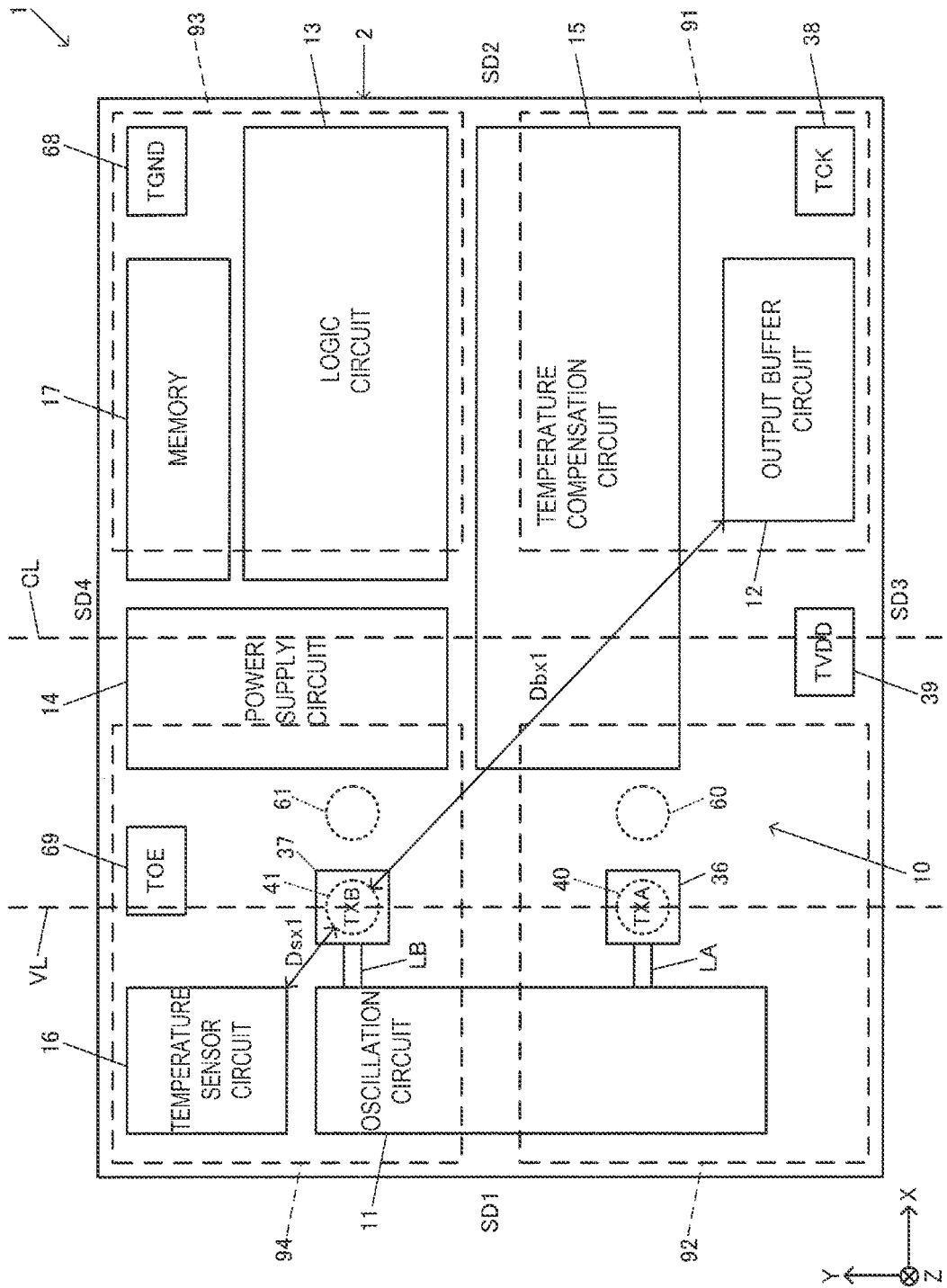
FIG. 11 is a plan view showing the arrangement of the through electrodes and circuits that form the integrated circuit.

The temperature sensor circuit 16 is placed in the vicinity of the edge SD1 than the through electrodes 40 and 41, as shown in FIG. 11. For example, the oscillation circuit 11 is also placed in the vicinity of the edge SD1 than the through electrodes 40 and 41, and the temperature sensor circuit 16 and the oscillation circuit 11 are placed along the edge SD1. Specifically, the temperature sensor circuit 16 is placed at the corner where the edges SD1 and SD4 intersect with each other. For example, let CL be the center line between the edges SD1 and SD2. For example, the distance between the edge SD1 and the center line CL is equal to the distance between the edge SD2 and the center line CL. In this case, the temperature sensor circuit 16 and the through electrodes 40 and 41 are placed, for example, in a first region that is the region between the edge SD1 and the center line CL. On the other hand, the output buffer circuit 12 is placed in a second region that is the region between the edge SD2 and the center line CL. The temperature sensor circuit 16 is placed in the first region between the edge SD1 and the center line CL in a position closer to the edge SD1 than the through electrodes 40 and 41. The temperature sensor circuit 16 can thus be placed in the vicinity of the through electrodes 41 and other components by effectively using the region between the edge SD1 and the through electrodes 40, 41. The temperature sensor circuit 16 and other components can thus be arranged in an efficient layout. At the same time, for example, placing the temperature sensor circuit 16 in the vicinity of the through electrode 41 can suppress the occurrence of degradation in the oscillation characteristics caused by the deviation of the temperature detected by the temperature sensor circuit 16 from the actual temperature of the vibrator 5.

Specifically, a line parallel to the first edge SD1 and passing through the through electrodes 40 and 41 is called an imaginary line VL, as shown in FIG. 11. In this case, the temperature sensor circuit 16 is placed in the region between the edge SD1 and the imaginary line VL. For example, a joint that joins the base 2 and the lid 7 to each other is present on the negative side of the through electrodes 40 and 41 in the axis-X direction, as shown in FIGS. 1 and 2. That is, the base 2 and the lid 7 are joined to each other via the joining member 72 at the joint. The through electrodes 40 and 41 are therefore located on the positive side of the joint between the base 2 and the lid 7 in the axis-X direction. Therefore, in the integrated circuit 10, the region on the negative side of the through electrodes 40 and 41 in the axis-X direction may undesirably form a dead space. In this regard, in the present embodiment, the temperature sensor circuit 16 is placed in the region between the edge SD1 and the imaginary line VL, which may a dead space, as shown in FIG. 11. The arrangement described above prevents a dead space from being created in the layout in the integrated circuit 10 and allows an efficient layout in the integrated circuit 10. Furthermore, placing the temperature sensor circuit 16 in the region between the edge SD1 and the imaginary line VL, which passes through the through electrodes 40 and 41, allows a decrease in the distance between the temperature sensor circuit 16 and the through electrodes 40, 41. The occurrence of degradation in the oscillation characteristics caused by the deviation of the temperature detected by the temperature sensor circuit 16 from the actual temperature of the vibrator 5 can therefore be suppressed.

In FIG. 11, the temperature sensor circuit 16 and the oscillation circuit 11 are placed in the region between the edge SD1 and the imaginary line VL. For example, the temperature sensor circuit 16 and the oscillation circuit 11 are placed along the edge SD1 in the region between the edge SD1 and the imaginary line VL. For example, the temperature sensor circuit 16 and the oscillation circuit 11 are placed so as to be adjacent to the through electrodes 40 and 41.

The temperature sensor circuit 16 and the oscillation circuit 11 can thus be placed by effectively using the region that is located between the edge SD1 and the imaginary line VL and may form a dead space. The arrangement described above prevents a dead space from being created in the layout in the integrated circuit 10 and allows an efficient layout in the integrated circuit 10. Placing the oscillation circuit 11 in the region described above allows short-path coupling between the oscillation circuit 11 and the through electrodes 40, 41 via the wiring lines LA and LB. Parasitic resistance and parasitic capacitance of the wiring lines LA and LB can therefore be reduced, whereby degradation in the oscillation characteristics of the oscillation circuit 11 caused by the parasitic resistance and parasitic capacitance can be suppressed.

The through electrodes 40 and 41 are placed between the side SD1 and the joining members 60 and 61 joined to the vibrator 5 in the plan view viewed in the direction perpendicular to the first surface 21 of the semiconductor substrate 20, as shown in FIGS. 11, 1, and 2. For example, the through electrodes 40 and 41 and the joining members 60 and 61 are arranged in this order from the side facing the edge SD1 toward the side facing the edge SD2 in the plan view. For example, the through electrodes 40 and 41 and the joining members 60 and 61 are placed so as to be adjacent to each other from the side facing the edge SD1 toward the side facing the edge SD2 in the plan view.

The actual temperature of the vibrator 5 is transmitted in the form of heat to the through electrodes 40 and 41 via the joining members 60 and 61 along a short heat conduction path along the direction from the edge SD2 toward the edge SD1, and the actual temperature of the vibrator 5 transmitted in the form of heat is detected by the temperature sensor circuit 16 placed in the vicinity of the through electrodes 40 and 41. The actual temperature of the vibrator 5 can therefore be detected along the short heat conduction path, and temperature compensation based on the detected actual temperature of the vibrator 5 can be performed on the oscillation frequency. As a result, temperature compensation can be performed under a small deviation condition, allowing suppression of the occurrence of degradation in the oscillation characteristics caused by the deviation of the temperature detected by the temperature sensor circuit 16 from the actual temperature of the vibrator 5.

The through electrodes 40 and 41 are placed between the output buffer circuit 12 and the temperature sensor circuit 16, as shown in FIG. 11. For example, let DR be the direction from the output buffer circuit 12 toward the temperature sensor circuit 16, and the through electrode 41 and other components are placed at a side of the output buffer circuit 12 that is the side facing in the direction DR, and the temperature sensor circuit 16 is placed at a side of the through electrode 41 and other components that is the side facing in the direction DR. For example, it can be said that the temperature sensor circuit 16, the through electrodes 40 and 41, and the output buffer circuit 12 are arranged in this order from the side facing the edge SD1 toward the side facing the edge SD2.

For example, when the vibration device 1 is activated and the output buffer circuit 12 generates heat, the period of time until the vibrator 5 is heated and the effect of the heating appears on the oscillation frequency is longer than the period of time until the effect of the heating appears on the result from the temperature sensor circuit 16. Arranging the output buffer circuit 12, the through electrodes 40 and 41, and the temperature sensor circuit 16 in such a way that the through electrodes 40 and 41 are placed between the output buffer circuit 12 and the temperature sensor circuit 16 therefore makes the vibrator 5 electrically coupled to the through electrodes 40 and 41 more susceptible to the heat generated by the output buffer circuit 12 than the temperature sensor circuit 16. For example, the heat generated by the output buffer circuit 12 is transmitted to the vibrator 5 via the through electrodes 40 and 41 and then transmitted to the temperature sensor circuit 16. The temperature detected by the temperature sensor circuit 16 and the actual temperature of the vibrator 5 can thus be brought closer to each other, whereby the occurrence of degradation in the oscillation characteristics caused by deviation of the temperature detected by the temperature sensor circuit 16 from the actual temperature of the vibrator 5 can be suppressed.

The temperature compensation circuit 15 is placed between the output buffer circuit 12 and the temperature sensor circuit 16. For example, at least part of the temperature compensation circuit 15 is placed within the region that couples the output buffer circuit 12 to the temperature sensor circuit 16. For example, under the definition that DR is the direction from the output buffer circuit 12 toward the temperature sensor circuit 16, the temperature compensation circuit 15 is placed at a side of the output buffer circuit 12 that is the side facing in the direction DR, and the temperature sensor circuit 16 is placed at a side of the temperature compensation circuit 15 that is the side facing in the direction DR. Specifically, the through electrode 41 and other components are placed at a side of the temperature compensation circuit 15 that is the side facing in the direction DR, and the temperature sensor circuit 16 is placed at a side of the through electrode 41 and other components that is the side facing in the direction DR.

For example, the temperature compensation circuit 15 is a circuit block that consumes less current than the output buffer circuit 12 and therefore generates less heat than the output buffer circuit 12. Placing the temperature compensation circuit 15 between the output buffer circuit 12 and the temperature sensor circuit 16 therefore causes the heat generated by the output buffer circuit 12 to be unlikely to be transmitted to the temperature sensor circuit 16. The arrangement described above can reduce deviation of the temperature detected by the temperature sensor circuit 16 from the actual temperature of the vibrator 5. Furthermore, each circuit block, such as the output buffer circuit 12, the temperature compensation circuit 15, and the temperature sensor circuit 16, can be efficiently placed within the limited layout area of the integrated circuit 10, whereby the layout area of the integrated circuit 10 can be reduced.

Figure 12:
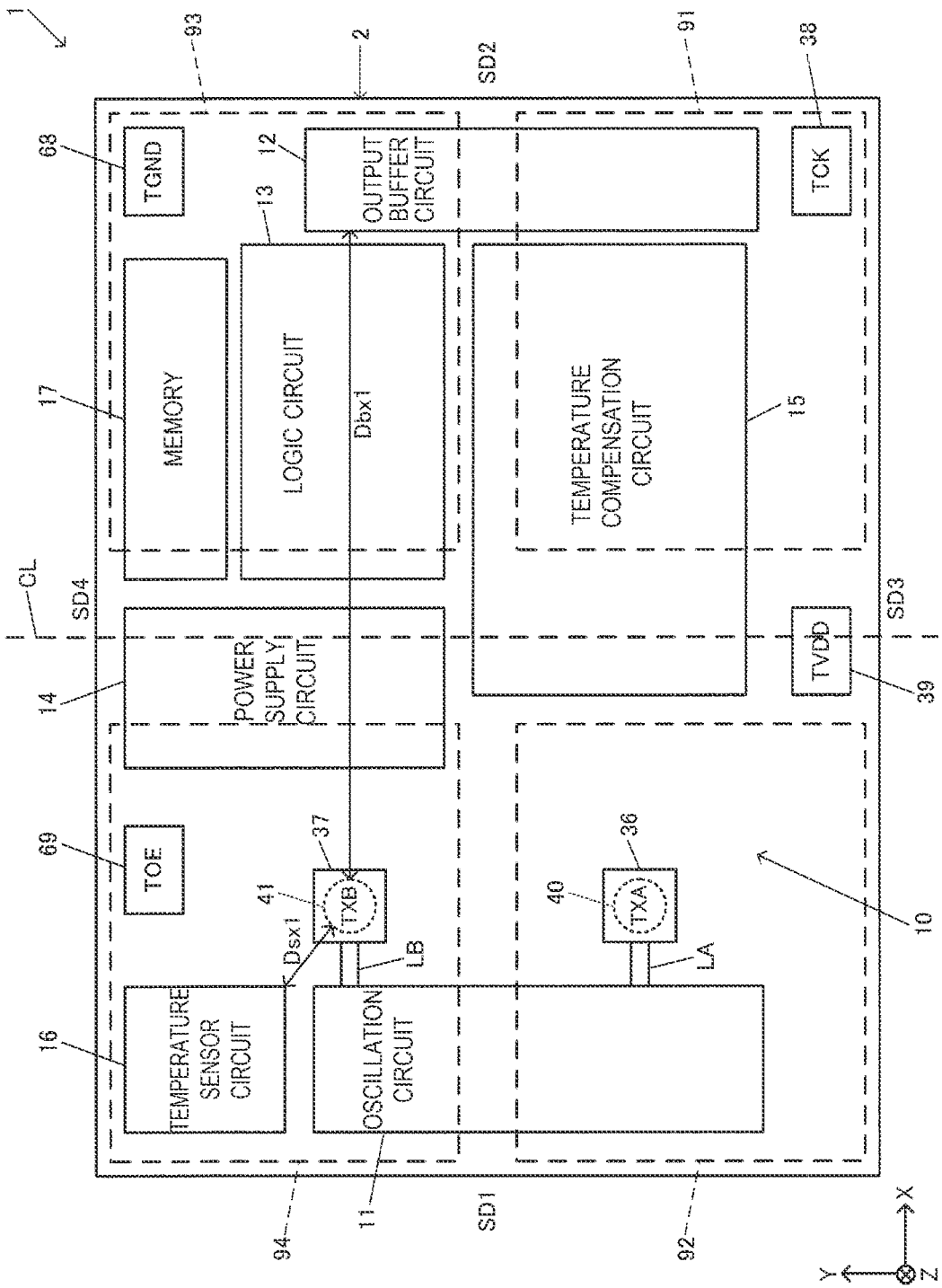
FIG. 12 is a plan view showing another example of the arrangement of the through electrodes and the circuits that form the integrated circuit.

In FIG. 11, the output buffer circuit 12 is placed along the edge SD3, and the output buffer circuit 12 may instead be placed along the edge SD2, as shown in FIG. 12. For example, the output buffer circuit 12 is so placed that the long edges of the output buffer circuit 12 extend along the edge SD2. The logic circuit 13, which is placed at the second surface 22 of the semiconductor substrate 20, is placed between the output buffer circuit 12 and the temperature sensor circuit 16, as shown in FIG. 12. For example, the logic circuit 13, which is the control circuit that performs a variety of types of control in the integrated circuit 10, is placed between the output buffer circuit 12 and the temperature sensor circuit 16. The temperature compensation circuit 15 is placed between the output buffer circuit 12 and the temperature sensor circuit 16 also in FIG. 12, as in FIG. 11.

For example, the logic circuit 13 is a circuit block that consumes less current than the output buffer circuit 12 and therefore generates less heat than the output buffer circuit 12. Placing the logic circuit 13 between the output buffer circuit 12 and the temperature sensor circuit 16 as described above therefore causes the heat generated by the output buffer circuit 12 to be unlikely to be transmitted to the temperature sensor circuit 16. The arrangement described above can reduce deviation of the temperature detected by the temperature sensor circuit 16 from the actual temperature of the vibrator 5. Furthermore, each circuit block, such as the output buffer circuit 12, the logic circuit 13, and the temperature sensor circuit 16, can be efficiently placed within the limited layout area of the integrated circuit 10, whereby the layout area of the integrated circuit 10 can be reduced.

It is assumed in FIGS. 11 and 12 that the direction from the edge SD1 toward the edge SD2 is a first direction, and that the direction from the edge SD3 toward the edge SD4 is a second direction. The first direction is the direction along the axis X, and the second direction is the direction along the axis Y. It is further assumed that the direction opposite the first direction is a third direction, and that the direction opposite the second direction is a fourth direction. Under the definitions described above, the oscillation circuit 11 is placed at a side of the edge SD1 that is the side facing in the first direction, and the through electrodes 40 and 41 are placed at a side of the oscillation circuit 11 that is the side facing in the first direction. The temperature sensor circuit 16 is placed at a side of the oscillation circuit 11 that is the side facing in the second direction. The output buffer circuit 12, the logic circuit 13, the power supply circuit 14, the temperature compensation circuit 15, and the memory 17 are placed at a side of the through electrodes 40 and 41 that is the side facing in the first direction. That is, the output buffer circuit 12, the logic circuit 13, the power supply circuit 14, the temperature compensation circuit 15, and the memory 17 are placed in the region between the through electrodes 40, 41 and the edge SD2. In FIG. 11, the temperature compensation circuit 15 is placed at a side of the output buffer circuit 12 that is the side facing in the second direction, the logic circuit 13 and the power supply circuit 14 are placed at a side of the temperature compensation circuit 15 that is the side facing in the second direction, and the memory 17 is placed at a side of the logic circuit 13 that is the side facing in the second direction. On the other hand, in FIG. 12, the logic circuit 13 and the temperature compensation circuit 15 are placed at a side of the output buffer circuit 12 that is the side facing in the third direction. The power supply circuit 14 is placed at a side of the logic circuit 13 that is the side facing in the third direction, and the memory 17 is placed at a side of the logic circuit 13 that is the side facing in the second direction. The third direction is the direction opposite the first direction and oriented from the edge SD2 toward the edge SD1.

The joining member 60 includes the bump 62 having one end electrically coupled to the vibrator 5 and the other end electrically coupled to the through electrode 40, as shown in FIGS. 1 and 2. The joining member 61 also includes a bump that is not shown but is similar to the bump 62, but the bump that forms the joining member 61 will not be described. The other end of the bump 62 is electrically coupled to the through electrode 40 via the terminal 64, for example, in FIGS. 1 and 2. The bump 62 can be a metal bump, such as a gold bump, a silver bump, a copper bump, or a solder bump. Using the bump 62, such as a metal bump, as the joining member 60 allows the heat generated by the output buffer circuit 12 to be likely to be transmitted from the through electrode 40 and other components to the vibrator 5 via the bump 62 and other components. The temperature sensor circuit 16 can then be used to detect the actual temperature of the vibrator 5 resulting from the heat generated by the output buffer circuit 12 with only a small amount of deviation contained in the detected temperature.

In the present embodiment, the vibration device 1 includes the lid 7, which is joined to the base 2 so as to accommodate the vibrator 5, as shown in FIG. 1. For example, the lid 7 is joined to the base 2 via the joining members 71 and 72. Providing the thus configured lid 7 allows the vibrator 5 to be placed in the accommodation space SP formed by joining the base 2 and the lid 7 to each other. For example, the vibrator 5 can be placed in the hermetically sealed accommodation space SP, whereby the vibrator 5 and other components can be preferably protected, for example, from impact, dust, heat, and moisture.

The lid 7 can be achieved by a silicon substrate, as the base 2 can. The coefficients of linear expansion of the base 2 and the lid 7 are therefore equal to each other, so that thermal stress caused by thermal expansion of the base 2 and the lid 7 is suppressed, whereby a vibration device 1 having excellent vibration characteristics can be achieved. The base 2 and the lid 7 can both be formed in a semiconductor manufacturing process. Therefore, the vibration device 1 can be manufactured with high precision, and the size of the vibration device 1 can be reduced. The lid 7 is, however, not necessarily achieved by a silicon substrate and may instead be achieved by a semiconductor substrate made, for example, of Ge, GaP, GaAs, or InP.

The vibration device 1 may be configured not to include the lid 7, which is joined to the base 2. For example, the base 2 with the vibrator 5 placed at the side facing the first surface 21 and the integrated circuit 10 formed at the second surface 22 may be accommodated in a separate package or in a container that serves as a thermostatic oven in an oven controlled crystal oscillator (OCXO).

In the vibration device 1 according to the present embodiment, the through electrodes 40 and 41 and the external connection terminal 91 are arranged so as not to overlap with each other in the plan view viewed in the direction perpendicular to the first surface 21, as shown, for example, in FIGS. 1, 2, and 8. For example, the through electrodes 40 and 41, which electrically couple the vibrator 5 to the integrated circuit 10, and the external connection terminal 91, via which the clock signal CK is outputted, are arranged so as not to overlap with each other in the plan view viewed in the axis-Z direction. As described above, in the WLP (wafer level package) vibration device 1 according to the present embodiment including the integrated circuit 10, which includes the oscillation circuit 11 and the output buffer circuit 12, and the vibrator 5, the through electrodes 40 and 41, which electrically couple the vibrator 5 to the oscillation circuit 11 of the integrated circuit 10, and the external connection terminal 91 for outputting the clock signal CK are arranged so as not to overlap with each other in the plan view. That is, arranging the through electrodes 40 and 41, which are part of the wiring lines electrically coupled to the vibrator 5, and an external connection terminal through which an AC signal flows, such as the external connection terminal 91 for outputting the clock signal CK based on the oscillation signal OSC, so as not to overlap with each other in the plan view reduces the capacitance of the capacitive coupling between the through electrodes 40, 41 and the external connection terminal 91.

For example, in the present embodiment, since the vibrator 5 is directly mounted on the semiconductor substrate 20, unlike a vibrator using a ceramic package in related art, to form the vibration device 1, there are the following problems specific to the configuration in the present embodiment: In the package of the vibration device 1, which has a compact size achieved by WLP, the integrated circuit 10 is formed at the second surface 22, which is the lower surface of the semiconductor substrate 20, which forms part of the airtight package, and the through electrodes 40 and 41, which are called conduction vias or through holes and electrically coupled to the vibrator 5, are formed in the semiconductor substrate 20. The through electrodes 40 and 41, to which the vibrator 5 is electrically coupled, adversely affect the oscillation frequency and other oscillation characteristics particularly when a terminal or an electrode for an AC or an alternating current signal is placed in the vicinity of the through electrodes 40 and 41 and capacitively coupled thereto. The insulating layer 80 having a thin film thickness and formed of a resin layer made, for example, of polyimide is formed at the second surface 22 of the semiconductor substrate 20, such as a silicon substrate, and furthermore, for example, the four external connection terminals 91 to 94 are formed at the lower surface of the insulating layer 80. The insulating layer 80 is thinner than the semiconductor substrate 20 and has a film thickness, for example, smaller than or equal to 0.1 mm. The thin insulating layers 44 are also formed around the through electrodes 40 and 41, as shown in FIG. 2. The semiconductor substrate 20, which can be a dielectric or a conductor, is interposed between the through electrodes 40, 41 and the external connection terminals 91 to 94, unlike in ceramic packages in related art. Therefore, if the through electrodes 40 and 41 and the external connection terminal 91 for outputting the clock signal CK, which is an AC signal, are arranged so as to overlap each other in the plan view, the through electrodes 40 and 41 and the external connection terminal 91 arranged via the thin insulating layers 80 and 44 and other components undesirably increase the degree of the capacitive coupling, which adversely affects the oscillation characteristics. That is, since the capacitance value is inversely proportional to the inter-electrode distance, the capacitance produced by the thin insulating layers 80 and 44 undesirably increases. When the capacitance of the capacitive coupling between the through electrodes 40, 41 and the external connection terminal 91 increases, the signal components of the clock signal CK at the external connection terminal 91 are transmitted as noise to the vibrator 5 and the oscillation circuit 11 via the through electrodes 40 and 41, causing problems, such as degradation in the oscillation characteristics.

In view of the situation described above, in the present embodiment, the through electrodes 40 and 41, which are electrically coupled to the vibrator 5, and the external connection terminal 91, via which the clock signal CK, which is an AC signal, is outputted, are arranged so as not to overlap with each other in the plan view, as shown in FIG. 8 and other figures. When the through electrodes 40 and 41 and the external connection terminal 91 are arranged so as not to overlap with each other in the plan view as described above, the distance between the through electrodes 40, 41 and the external connection terminal 91 can be increased as compared with a case where the through electrodes 40 and 41 and the external connection terminal 91 are arranged so as to overlap with each other in the plan view. The capacitance of the capacitive coupling between the through electrodes 40, 41 and the external connection terminal 91 can thus be reduced, whereby degradation in the oscillation characteristics of the vibrator 5 and other undesirable situations can be effectively suppressed.

The external connection terminals 91 to 94 of the vibration device 1 are coupled, for example, by soldering to terminals and wiring lines of a circuit substrate on which the vibration device 1 is mounted. Therefore, the external connection terminals 91 to 94 are desirably terminals suitable for mounting, such as soldering, and also need to be thermally resistant and strong enough not to be damaged during the mounting.

In this regard, it is conceivable to use pads of the integrated circuit as external connection terminals. For example, pads formed by the uppermost metal layer of a wiring layer are used as the external connection terminals. The pads of the integrated circuit are, however, not terminals suitable for mounting, such as soldering, and the small area, low thermal resistance, and small strength of the pads may cause problems, for example, that the pads are damaged during the mounting.

In contrast, the vibration device 1 according to the present embodiment uses the external connection terminals 91 to 94 provided at the side facing the second surface 22 of the semiconductor substrate 20 via the insulating layer 80. That is, in place of the contact pads 38, 39, 68, and 69 of the integrated circuit 10, the vibration device 1 uses the external connection terminals 91 to 94, which are provided separately from the pads and formed, for example, in the step of manufacturing the relocation wiring layer 8. Terminals suitable for mounting, such as soldering, can therefore be used as the external connection terminals 91 to 94. For example, the external connection terminals 91 to 94 can have larger areas than the contact pads 38, 39, 68, and 69, and can also be thicker with the strength maintained. Therefore, the external connection terminals 91 to 94 can be readily coupled to external terminals and wiring lines to mount the vibration device 1, and damage and other undesirable situations during the mounting can also be suppressed.

On the other hand, when the external connection terminals 91 to 94 have large areas as described above, the capacitive coupling between, for example, the through electrodes 40, 41 and the external connection terminal 91 may undesirably have large capacitance. In this regard, in the present embodiment, since the through electrodes 40 and 41 and the external connection terminal 91 are arranged so as not to overlap with each other in the plan view, the degradation in the oscillation characteristics caused by the capacitive coupling can be suppressed even when the external connection terminal 91 has a large area. Therefore, the present embodiment can provide the external connection terminals 91 to 94, which are readily coupled to external terminals and wiring lines and have so high thermal resistance and large strength that the external connection terminals 91 to 94 are unlikely to be damaged, and can also suppress the degradation in the oscillation characteristics caused by the capacitive coupling between the through electrodes 40, 41 and the external connection terminal 91.

3. Variations

Figure 13:
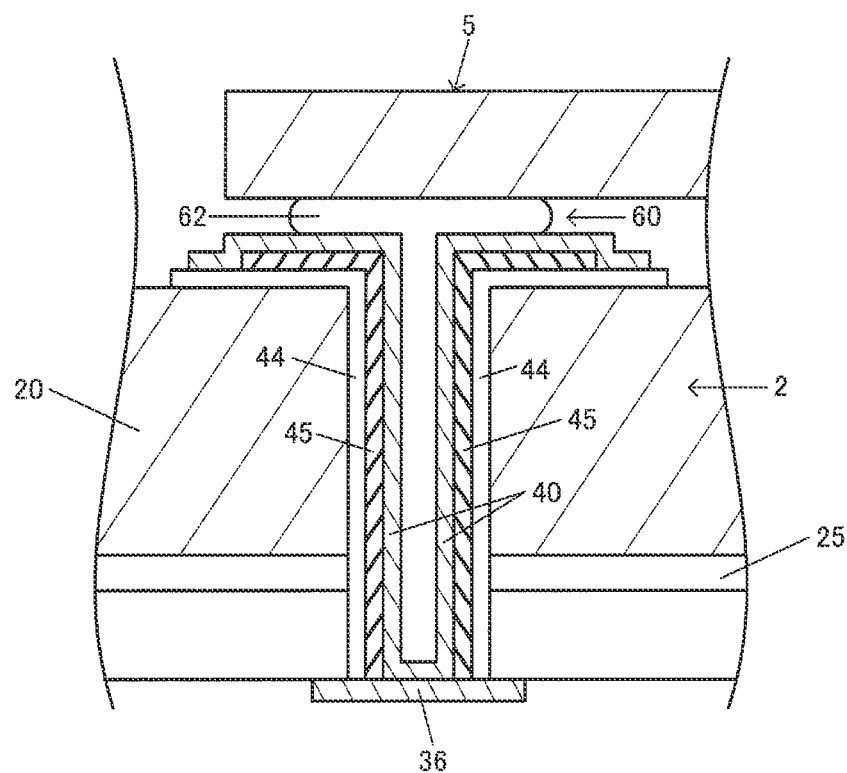
FIG. 13 is a cross-sectional view showing another example of the through electrodes.

A variety of variations of the present embodiment will next be described. For example, FIG. 13 shows another example of the through electrode 40. The through electrode 41 has the same configuration and will therefore not be described. In FIG. 13, the insulating layer 44 is formed at the inner wall of the through hole in the base 2, and a resin layer 45 is further formed at the inner side of the insulating layer 44. The through electrode 40 is formed of a metal layer formed at the inner side of the resin layer 45. The thus configured through electrode 40 allows electrical coupling between the vibrator 5 and the oscillation circuit 11 of the integrated circuit 10. That is, the vibrator 5 and the contact pad 36 of the integrated circuit 10 are electrically coupled to each other via the joining member 60, which is formed of the bump 62, and the through electrode 40, and the contact pad 36 is electrically coupled as the terminals TXA and TXB in FIG. 4 to the oscillation circuit 11, so that the vibrator 5 is electrically coupled to the oscillation circuit 11.

Figure 14:
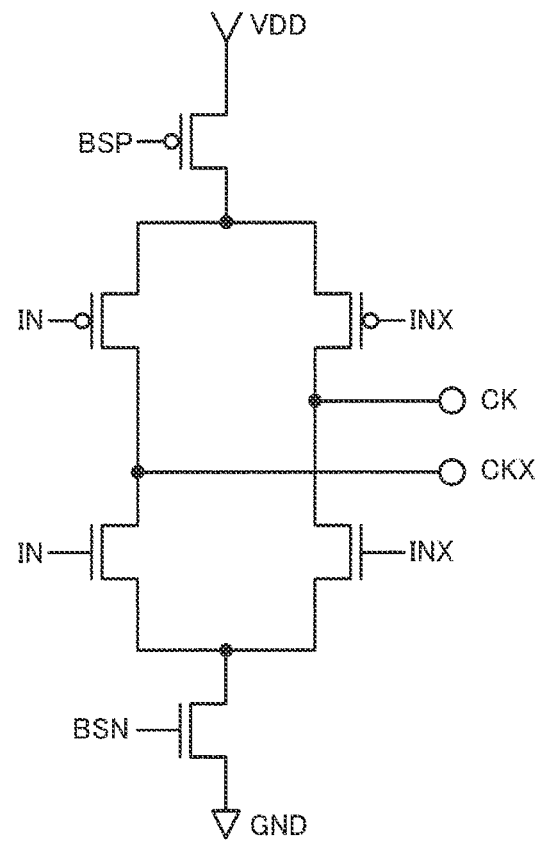
FIG. 14 shows another example of the configuration of an output driver of the output buffer driver.
Figure 15:
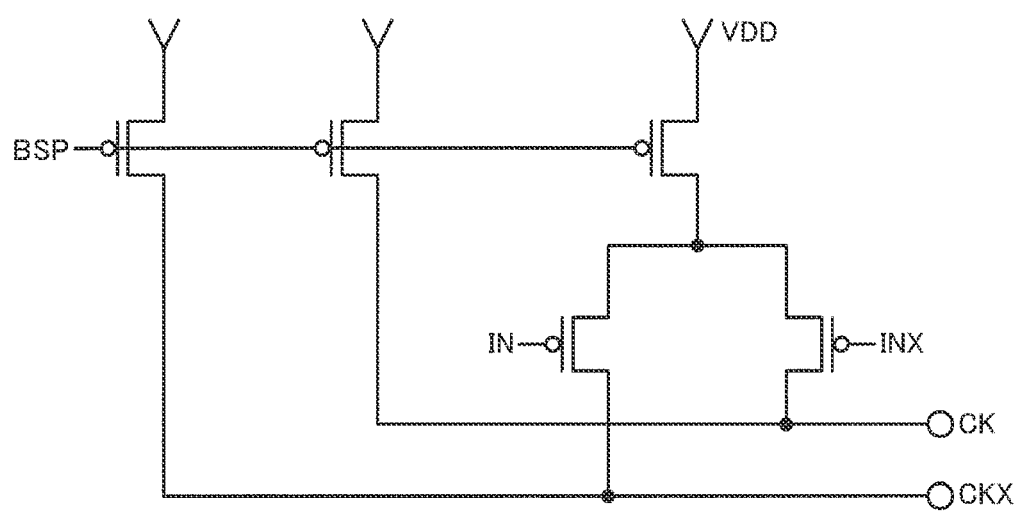
FIG. 15 shows another example of the configuration of the output driver of the output buffer driver.

The output buffer circuit 12 may output differential clock signals CK and CKX in a signal format, such as LVDS (low voltage differential signaling), PECL (positive emitter coupled logic), HCSL (high speed current steering logic), or differential CMOS (complementary MOS), to a component outside the output buffer circuit 12. That is, the output buffer circuit 12 may include an output driver for LVDS, PECL, HCSL, or differential CMOS. For example, FIG. 14 shows an example of the configuration of an output driver for LVDS. The output driver includes a P-type transistor for a current source that causes a drive current of 3.5 mA to flow, P-type and N-type transistors that form a differential section to which differential input signals IN and INX are inputted and which outputs the differential clock signals CK and CKX, and an N-type transistor provided at the side facing GND. Bias voltage BSP is applied to the gate of the P-type transistor that serves as the current source. The drive current of 3.5 mA thus flows. FIG. 15 shows an example of the configuration of an output driver for PECL. The output driver includes a P-type transistor that causes a drive current of 15.25 mA to flow, two P-type transistors that form a differential section, and two P-type transistors that form a bias current circuit that causes a bias current of 5.7 mA to flow to the nodes for the clock signals CK and CKX.

Figure 16:
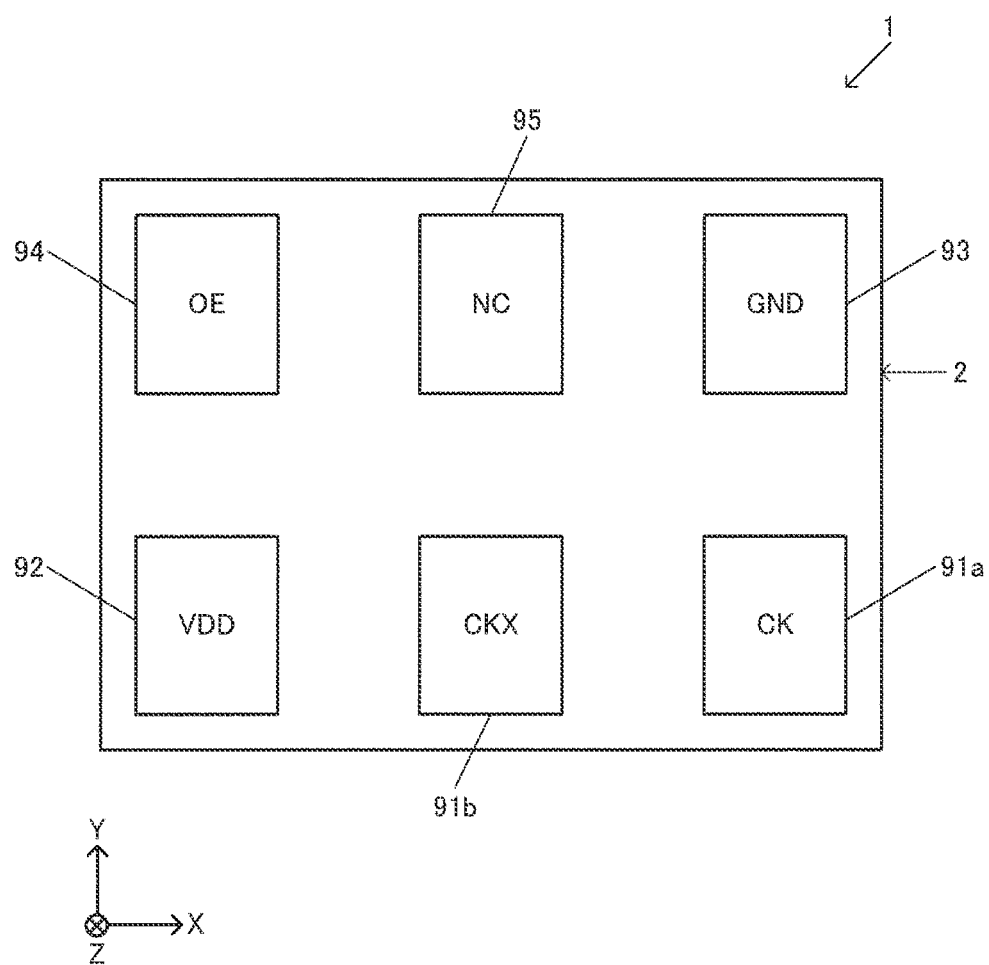
FIG. 16 is a plan view showing another example of the arrangement of the external connection terminals.

FIG. 16 shows an example of the arrangement of the external connection terminals that output the differential clock signals CK and CKX, as shown in FIGS. 14 and 15. In FIG. 16, the vibration device 1 has six external connection terminals or external connection terminals 91a, 91b, 92, 93, 94, and 95. The external connection terminals 91a and 91b are terminals via which the differential clock signals CK and CKX are outputted. The external connection terminals 92 and 93 are terminals for VDD and GND, and the external connection terminal 94 is a terminal for the output enable signal OE. The external connection terminal 95 is an NC (non-connection) terminal. The external connection terminals 91a, 91b, 92, 93, 94, and 95 in FIG. 16 are also provided at the side facing the second surface 22 of the semiconductor substrate 20 of the base 2 via the insulating layer 80 in the vibration device 1. The through electrodes 40 and 41 and the external connection terminals 91a and 91b for outputting the differential clock signals CK and CKX are arranged so as not to overlap with each other in the plan view.

As described above, a vibration device according to the present embodiment includes a base including a semiconductor substrate having a first surface that is a front surface and a second surface that is a rear surface and a through electrode that passes through the portion between the first and second surfaces, and a vibrator fixed to the first surface via an electrically conductive joining member. The following components are placed at the second surface: an oscillation circuit that is electrically coupled to the vibrator via the through electrode and generates an oscillation signal by causing the vibrator to oscillate; a temperature sensor circuit; a temperature compensation circuit that performs temperature compensation on the oscillation signal based on the output from the temperature sensor circuit; and an output buffer circuit that outputs a clock signal based on the temperature compensated oscillation signal. Dsx1<Dbx1 is satisfied, where Dbx1 represents the distance between the output buffer circuit and the through electrode, and Dsx1 represents the distance between the temperature sensor circuit and the through electrode.

As described above, the vibration device according to the present embodiment includes the base including the semiconductor substrate and the through electrode passing through the semiconductor substrate, and the vibrator fixed to the first surface of the semiconductor substrate via an electrically conductive fixing member. The oscillation circuit, the temperature sensor circuit, the temperature compensation circuit, and the output buffer circuit are placed at the second surface of the semiconductor substrate. Dsx1<Dbx1 is satisfied, where Dbx1 represents the distance between the output buffer circuit and the through electrode, and Dsx1 represents the distance between the temperature sensor circuit and the through electrode. As described above, in the vibration device according to the present embodiment, since the vibrator is fixed to the semiconductor substrate via the joining member, the heat generated by the output buffer circuit is likely to be transmitted to the vibrator. On the other hand, since the distance Dsx1 between the temperature sensor circuit and the through electrode is small, the temperature sensor circuit can detect the actual temperature of the vibrator, which has risen due to the heat generated in the output buffer circuit, in a short period of time. The occurrence of degradation in the oscillation characteristics caused by deviation of the temperature detected by the temperature sensor circuit from the actual temperature of the vibrator can therefore be suppressed.

In the present embodiment, the base may include a first through electrode and a second through electrode, which form the through electrode described above, and the oscillation circuit may be electrically coupled to the vibrator via the first and second through electrodes. Dsx<Dbx1 and Dsx<Dbx2 may be satisfied, where Dbx2 represents the distance between the output buffer circuit and the second through electrode, and Dsx is the shorter one of the distance Dsx1 between the temperature sensor circuit and the first through electrode and the distance Dsx2 between the temperature sensor circuit and the second through electrode.

When the relationships described above are satisfied, the distance Dsx1, which is the distance to the through electrode closer to the temperature sensor circuit, decreases, whereby the temperature sensor circuit located in the vicinity of the through electrode can detect in a short period of time the actual temperature of the vibrator transmitted along the heat conduction path via the through electrode.

In the present embodiment, the base may have a first edge and a second edge facing the first edge, and the temperature sensor circuit may be placed in a position closer to the first edge than the through electrode.

As a result, the temperature sensor circuit can be efficiently placed in the layout of the variety of components, and placing the temperature sensor circuit in the vicinity of the through electrode can suppress the occurrence of degradation in the oscillation characteristics caused by deviation of the temperature detected by the temperature sensor circuit from the actual temperature of the vibrator.

In the present embodiment, the temperature sensor circuit may be placed in the region between the first edge and an imaginary line parallel to the first edge and passing through the through electrode.

The temperature sensor circuit can thus be placed by effectively using the region between the first edge and the imaginary line, whereby efficient placement of the temperature sensor circuit in the layout of the variety of components can be achieved. Furthermore, the distance between the temperature sensor circuit and the through electrode can be shortened, which can suppress the occurrence of degradation in the oscillation characteristics caused by deviation of the temperature detected by the temperature sensor circuit from the actual temperature of the vibrator.

In the present embodiment, the temperature sensor circuit and the oscillation circuit may be placed in the region described above.

The temperature sensor circuit and the oscillation circuit can thus be placed by effectively using the region between the first edge and the imaginary line, whereby efficient placement of the temperature sensor circuit and the oscillation circuit in the layout of the variety of components can be achieved.

In the present embodiment, the through electrode may be placed between the joining member and the first edge in the plan view viewed in the direction perpendicular to the first surface.

The actual temperature of the vibrator is thus transmitted in the form of heat to the through electrode via the joining member along a short heat conduction path along the direction from the second edge toward the first edge, and the actual temperature of the vibrator transmitted in the form of heat can be detected by the temperature sensor circuit placed in the vicinity of the through electrode.

In the present embodiment, the through electrode may be placed between the output buffer circuit and the temperature sensor circuit.

The heat generated by the output buffer circuit is thus transmitted to the vibrator via the through electrode and thereafter to the temperature sensor circuit, whereby the temperature detected by the temperature sensor circuit can be made closer to the actual temperature of the vibrator.

In the present embodiment, the temperature compensation circuit may be placed between the output buffer circuit and the temperature sensor circuit.

Placing the temperature compensation circuit, which generates less heat than the output buffer circuit, between the output buffer circuit and the temperature sensor circuit causes the heat generated by the output buffer circuit to be unlikely to be transmitted to the temperature sensor circuit, whereby deviation of the temperature detected by the temperature sensor circuit from the actual temperature of the vibrator can be reduced.

In the present embodiment, a logic circuit may be placed at the second surface and between the output buffer circuit and the temperature sensor circuit.

Placing the logic circuit, which generates less heat than the output buffer circuit, between the output buffer circuit and the temperature sensor circuit causes the heat generated by the output buffer circuit to be unlikely to be transmitted to the temperature sensor circuit, whereby deviation of the temperature detected by the temperature sensor circuit from the actual temperature of the vibrator can be reduced.

In the present embodiment, the joining member may include a bump having one end electrically coupled to the vibrator and the other end electrically coupled to the through electrode.

Using the bump as the joining member as described above causes the heat generated by the output buffer circuit to be likely to be transmitted from the through electrode to the vibrator via the bump, whereby the temperature sensor circuit can be used to detect with only a small amount of deviation the actual temperature of the vibrator raised by the heat generated by the output buffer circuit.

In the present embodiment, the vibration device may include a lid joined to the base so as to accommodate the vibrator.

The vibrator can thus be placed in an accommodation space formed by the base and the lid, whereby the vibrator can be preferably protected, for example, from impact, dust, heat, or moisture.

The present embodiment has been described above in detail, and a person skilled in the art will readily appreciate that a large number of variations are conceivable to the extent that they do not substantially depart from the novel items and effects of the present disclosure. Such variations are all therefore assumed to fall within the scope of the present disclosure. For example, a term described at least once in the specification or the drawings along with a different term having a broader meaning or the same meaning can be replaced with the different term anywhere in the specification or the drawings. Furthermore, all combinations of the present embodiment and the variations fall within the scope of the present disclosure. Moreover, the configuration, operation, and other factors of the vibration device are not limited to those described in the present embodiment and can be changed in a variety manners.

What is claimed is:

1. A vibration device comprising:
   a base including a semiconductor substrate having a first surface that is a front surface and a second surface that is a rear surface and a through electrode that passes through a portion between the first and second surfaces; and
   a vibrator fixed to the first surface via an electrically conductive joining member,
   wherein components below are placed at the second surface,
   an oscillation circuit that is electrically coupled to the vibrator via the through electrode and generates an oscillation signal by causing the vibrator to oscillate,
   a temperature sensor circuit,
   a temperature compensation circuit that performs temperature compensation on the oscillation signal based on an output from the temperature sensor circuit, and
   an output buffer circuit that outputs a clock signal based on the temperature compensated oscillation signal, and $$Dsx1 < Dbx1,$$

a distance between the output buffer circuit and the through electrode is Dbx1, and a distance between the temperature sensor circuit and the through electrode is Dsx1.

2. The vibration device according to claim 1,
wherein the base includes a first through electrode and a second through electrode, which form the through electrode,
the oscillation circuit is electrically coupled to the vibrator via the first and second through electrodes, and $$Dsx < Dbx1 \text{ and } Dsx < Dbx2,$$

a distance between the output buffer circuit and the second through electrode is Dbx2, and
a shorter one of a distance Dsx1 between the temperature sensor circuit and the first through electrode and a distance Dsx2 between the temperature sensor circuit and the second through electrode is Dsx.

3. The vibration device according to claim 1,
wherein the base has a first edge and a second edge facing the first edge, and
the temperature sensor circuit is placed in a position closer to the first edge than the through electrode.

4. The vibration device according to claim 3,
wherein the temperature sensor circuit is placed in a region between the first edge and an imaginary line parallel to the first edge and passing through the through electrode.

5. The vibration device according to claim 4,
wherein the temperature sensor circuit and the oscillation circuit are placed in the region.

6. The vibration device according to claim 3,
wherein the through electrode is placed between the joining member and the first edge in a plan view viewed in a direction perpendicular to the first surface.

7. The vibration device according to claim 1,
wherein the through electrode is placed between the output buffer circuit and the temperature sensor circuit.

8. The vibration device according to claim 1,
wherein the temperature compensation circuit is placed between the output buffer circuit and the temperature sensor circuit.

9. The vibration device according to claim 1,
wherein a logic circuit is placed at the second surface and between the output buffer circuit and the temperature sensor circuit.

10. The vibration device according to claim 1,
wherein the joining member includes a bump having one end electrically coupled to the vibrator and another end electrically coupled to the through electrode.

11. The vibration device according to claim 1,
further comprising a lid joined to the base so as to accommodate the vibrator.

* * * * *